(12) United States Patent
Choi et al.

(10) Patent No.: US 11,075,221 B2
(45) Date of Patent: Jul. 27, 2021

(54) THIN-FILM TRANSISTOR SUBSTRATE HAVING OVERLAPPING THIN-FILM TRANSISTOR

(71) Applicant: Samsung Display Co., Ltd., Yongin-Si (KR)

(72) Inventors: Jong-Hyun Choi, Seoul (KR); Tae-Jin Kim, Hwaseong-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/853,485

(22) Filed: Apr. 20, 2020

(65) Prior Publication Data

US 2020/0243570 A1     Jul. 30, 2020

Related U.S. Application Data

(62) Division of application No. 15/833,757, filed on Dec. 6, 2017, now Pat. No. 10,658,393.

(30) Foreign Application Priority Data

Dec. 7, 2016   (KR) .................. 10-2016-0165739

(51) Int. Cl.
*H01L 27/12*      (2006.01)
*H01L 29/78*      (2006.01)
*H01L 29/786*     (2006.01)

(52) U.S. Cl.
CPC ........ *H01L 27/1225* (2013.01); *H01L 27/124* (2013.01); *H01L 27/1255* (2013.01); *H01L 29/78696* (2013.01); *H01L 27/1251* (2013.01)

(58) Field of Classification Search
CPC ............... H01L 27/1225; H01L 27/124; H01L 27/1255; H01L 27/1251; H01L 29/78696
See application file for complete search history.

(56) References Cited

U.S. PATENT DOCUMENTS

| | | | |
|---|---|---|---|
| 6,717,180 B2 | 4/2004 | Yamazaki et al. | |
| 7,283,182 B2 * | 10/2007 | Sato | G02F 1/136209 349/110 |
| 7,306,981 B2 | 12/2007 | Kuwabara et al. | |
| 7,479,673 B2 | 1/2009 | Jang et al. | |
| 7,642,555 B2 * | 1/2010 | Ishikawa | H01L 24/97 257/60 |
| 7,719,033 B2 | 5/2010 | Jeong et al. | |
| 7,927,932 B2 * | 4/2011 | Park | H01L 27/1108 438/153 |

(Continued)

FOREIGN PATENT DOCUMENTS

| | | |
|---|---|---|
| JP | 2007251100 A | 9/2007 |
| KR | 1020100086256 | 7/2010 |
| KR | 1020160027907 A | 3/2016 |

*Primary Examiner* — Ida M Soward
(74) *Attorney, Agent, or Firm* — Innovation Counsel LLP

(57) ABSTRACT

A thin-film transistor substrate may include a first thin-film transistor and a second thin-film transistor which are disposed on a substrate. The first thin-film transistor may include a first semiconductor layer, a first gate electrode, and a first electrode. The second thin-film transistor may include a second semiconductor layer disposed on the first semiconductor layer and overlapping at least a portion of the first semiconductor layer, a second gate electrode, and a second electrode electrically connected to the first electrode. The second electrode may overlap the first electrode.

10 Claims, 21 Drawing Sheets

(56) References Cited

U.S. PATENT DOCUMENTS

| | | | |
|---|---|---|---|
| 7,982,221 | B2 | 7/2011 | Han et al. |
| 7,999,464 | B2 * | 8/2011 | Komatsu ............... H05B 33/14 |
| | | | 313/506 |
| 8,153,506 | B2 | 4/2012 | Anzai et al. |
| 8,232,598 | B2 * | 7/2012 | Yamazaki ........... H01L 27/0688 |
| | | | 257/351 |
| 8,384,084 | B2 | 2/2013 | Yamazaki et al. |
| 8,619,454 | B2 * | 12/2013 | Yamazaki ................ G11C 7/18 |
| | | | 365/72 |
| 9,954,111 | B2 * | 4/2018 | Yamazaki ........... H01L 27/0688 |
| 10,090,336 | B2 | 10/2018 | Han |
| 10,186,604 | B2 * | 1/2019 | Ando .................... C23C 14/086 |
| 2003/0141504 | A1 * | 7/2003 | Kuwahara ......... H01L 29/78648 |
| | | | 257/66 |
| 2006/0119259 | A1 | 6/2006 | Bae et al. |
| 2006/0163571 | A1 | 7/2006 | Lim et al. |
| 2008/0023728 | A1 | 1/2008 | Jang et al. |
| 2008/0090344 | A1 | 4/2008 | Kuwabara et al. |
| 2009/0224330 | A1 | 9/2009 | Hong et al. |
| 2010/0038618 | A1 * | 2/2010 | Takano ................... H01L 27/12 |
| | | | 257/2 |
| 2011/0121298 | A1 * | 5/2011 | Ichiryu ................ H01L 29/458 |
| | | | 257/57 |
| 2013/0026478 | A1 | 1/2013 | Noda et al. |
| 2014/0197412 | A1 * | 7/2014 | Nishimura ........ H01L 29/78633 |
| | | | 257/57 |
| 2015/0348909 | A1 * | 12/2015 | Yamazaki ........... H01L 27/0688 |
| | | | 257/775 |
| 2016/0064421 | A1 | 3/2016 | Oh |
| 2018/0190677 | A1 | 7/2018 | Isobe et al. |

* cited by examiner

THIN-FILM TRANSISTOR SUBSTRATE HAVING OVERLAPPING THIN-FILM TRANSISTOR

CROSS-REFERENCE TO RELATED APPLICATION(S)

This application is a divisional application of U.S. patent application Ser. No. 15/833,757 filed on Dec. 6, 2017, which claims priority under 35 USC § 119 to Korean Patent Application No. 10-2016-0165739, filed on Dec. 7, 2016 in the Korean Intellectual Property Office (KIPO), the entire disclosure of which is incorporated by reference herein.

BACKGROUND

1. Field

Exemplary embodiments relate to thin-film transistor substrates. More particularly, exemplary embodiments relate to thin-film transistor substrates included in display devices and methods of manufacturing the thin-film transistor substrates.

2. Description of the Related Art

Recently, various flat panel display devices have been broadly used as display devices. Among the flat panel display devices, an organic light emitting display (OLED) device has attracted attention due to advantage such as a slim thickness, a light weight, a low power consumption, a fast response speed, or the like.

The OLED device may be divided into a passive matrix OLED device and an active matrix OLED device according to a driving manner. The active matrix OLED device may include a thin-film transistor substrate including a plurality of thin-film transistors.

Generally, the thin-film transistor may include a semiconductor layer. The semiconductor layer may be formed of amorphous semiconductor, polycrystalline semiconductor, oxide semiconductor, or the like. An electron mobility of the semiconductor layer may be relatively low when the semiconductor layer is formed of amorphous semiconductor, which is inappropriate for a display device driven in a high speed. Therefore, recent developments have the semiconductor layer formed of polycrystalline semiconductor or oxide semiconductor.

However, when the semiconductor layer is formed of polycrystalline semiconductor, an electron mobility of the polycrystalline semiconductor is relatively high but a threshold voltage of the polycrystalline semiconductor is not uniform due to polycrystalline nature thereof. Thus, a compensation circuit for compensating the threshold voltage may be necessary. Moreover, when the semiconductor layer is formed of oxide semiconductor, a threshold voltage of the oxide semiconductor is relatively low but an electron mobility of the oxide semiconductor is lower than that of the polycrystalline semiconductor.

SUMMARY

An object of the present disclosure is to provide a thin-film transistor substrate in which an area occupied by thin-film transistors decrease.

In order to achieve the object of the present disclosure described above, a thin-film transistor substrate according to an exemplary embodiment may include a first thin-film transistor disposed on a substrate and a second thin-film transistor. The first thin-film transistor may include a first semiconductor layer, a first gate electrode, and a first electrode. The second thin-film transistor may include a second gate electrode, a second electrode electrically connected to the first electrode, a second semiconductor layer disposed on the first semiconductor layer and overlapping at least a portion of the first semiconductor layer. The second electrode may overlap the first electrode.

In an exemplary embodiment, the first electrode may be one of a source electrode and a drain electrode of the first thin-film transistor. The second electrode may be one of a source electrode and a drain electrode of the second thin-film transistor.

In an exemplary embodiment, the first semiconductor layer may be formed of polycrystalline semiconductor.

In an exemplary embodiment, the first semiconductor layer may be a p-type semiconductor or an n-type semiconductor.

In an exemplary embodiment, the second semiconductor layer may be formed of oxide semiconductor.

In an exemplary embodiment, the second semiconductor layer may include at least one of gallium (Ga), indium (In), zinc (Zn), and tin (Sn) and oxygen (O).

In an exemplary embodiment, the second semiconductor layer may be an n-type semiconductor.

In an exemplary embodiment, the first gate electrode may be disposed between the first semiconductor layer and the first electrode.

In an exemplary embodiment, the thin-film transistor substrate may further include a contact hole formed on the first semiconductor layer. The contact hole may pass through the second semiconductor layer. At least a portion of the contact hole may overlap the first semiconductor layer and the second semiconductor layer, respectively. The first electrode and the second electrode may be disposed on the second semiconductor layer and integrally formed by filling the contact hole.

In an exemplary embodiment, the second gate electrode may face the second electrode with the second semiconductor layer interposed therebetween.

In an exemplary embodiment, the first gate electrode and the second gate electrode may be disposed at substantially the same level over the substrate.

In an exemplary embodiment, the second gate electrode may be disposed between the second semiconductor layer and the second electrode.

In an exemplary embodiment, the first gate electrode and the second semiconductor layer may be disposed at substantially the same level over the substrate.

In an exemplary embodiment, the thin-film transistor substrate may further include a contact hole formed on the first semiconductor layer. The contact hole may pass through the second semiconductor layer and the second electrode. At least a portion of the contact hole may overlap the first semiconductor layer and the second semiconductor layer, respectively. The first electrode may be disposed on the second semiconductor layer and contact the second electrode by filling the contact hole.

In an exemplary embodiment, the second electrode may be disposed between the first semiconductor layer and the second semiconductor layer.

In an exemplary embodiment, the second gate electrode may face the second semiconductor layer with the second electrode interposed therebetween.

In an exemplary embodiment, the first gate electrode and the second gate electrode may be disposed at substantially the same level over the substrate.

In an exemplary embodiment, the second gate electrode may face the second electrode with the second semiconductor layer interposed therebetween.

In an exemplary embodiment, the first gate electrode and the second electrode may be disposed at substantially the same level over the substrate.

In order to achieve the object of the present disclosure described above, a thin-film transistor substrate according to an exemplary embodiment may include a first thin-film transistor disposed on a substrate and a second thin-film transistor. The first thin-film transistor may include a first semiconductor layer and a first gate electrode. The second thin-film transistor may include a second gate electrode, a first electrode electrically connected to the first gate electrode, and a second semiconductor layer disposed on the first semiconductor layer and overlapping at least a portion of the first semiconductor layer. The first electrode may overlap the first gate electrode.

In an exemplary embodiment, the first electrode may be one of a source electrode and a drain electrode of the second thin-film transistor.

In an exemplary embodiment, the first gate electrode may be disposed between the first semiconductor layer and the first electrode.

In an exemplary embodiment, the thin-film transistor substrate may further include a contact hole formed on the first gate electrode. The contact hole may pass through the second semiconductor layer. At least a portion of the contact hole may overlap the first gate electrode and the second semiconductor layer, respectively. The first electrode may be disposed on the second semiconductor layer and contact the first gate electrode by filling the contact hole.

In an exemplary embodiment, the second gate electrode may face the first electrode with the second semiconductor layer interposed therebetween.

In an exemplary embodiment, the first gate electrode and the second gate electrode may be disposed at substantially the same level over the substrate.

In an exemplary embodiment, the thin-film transistor substrate may further include a contact hole formed on the first gate electrode and an auxiliary electrode disposed on the second semiconductor layer. The contact hole may pass through the second semiconductor layer and the first electrode. At least a portion of the contact hole may overlap the first gate electrode and the second semiconductor layer, respectively. The auxiliary electrode may be electrically connected to the first gate electrode and the second electrode by filling the contact hole.

In an exemplary embodiment, the first electrode may be disposed between the first semiconductor layer and the second semiconductor layer.

In an exemplary embodiment, the second gate electrode may face the second semiconductor layer with the first electrode interposed therebetween.

In an exemplary embodiment, the first gate electrode and the second gate electrode may be disposed at substantially the same level over the substrate.

The thin-film transistor substrate according to exemplary embodiments of the present disclosure may include the first thin-film transistor and the second thin-film transistor which are at least partially overlapped to each other. Moreover, an electrode of the first thin-film transistor and an electrode of the second thin-film transistor may be electrically connected through the contact hole vertically formed, so that an area occupied by the thin-film transistors may decrease.

BRIEF DESCRIPTION OF THE DRAWINGS

Illustrative, non-limiting exemplary embodiments will be more clearly understood from the following detailed description taken in conjunction with the accompanying drawings.

DETAILED DESCRIPTION OF THE EMBODIMENTS

Hereinafter, thin-film transistor substrates and methods of manufacturing the thin-film transistor substrates in accordance with exemplary embodiments of the present disclosure will be explained in detail with reference to the accompanying drawings.

Figure 1:
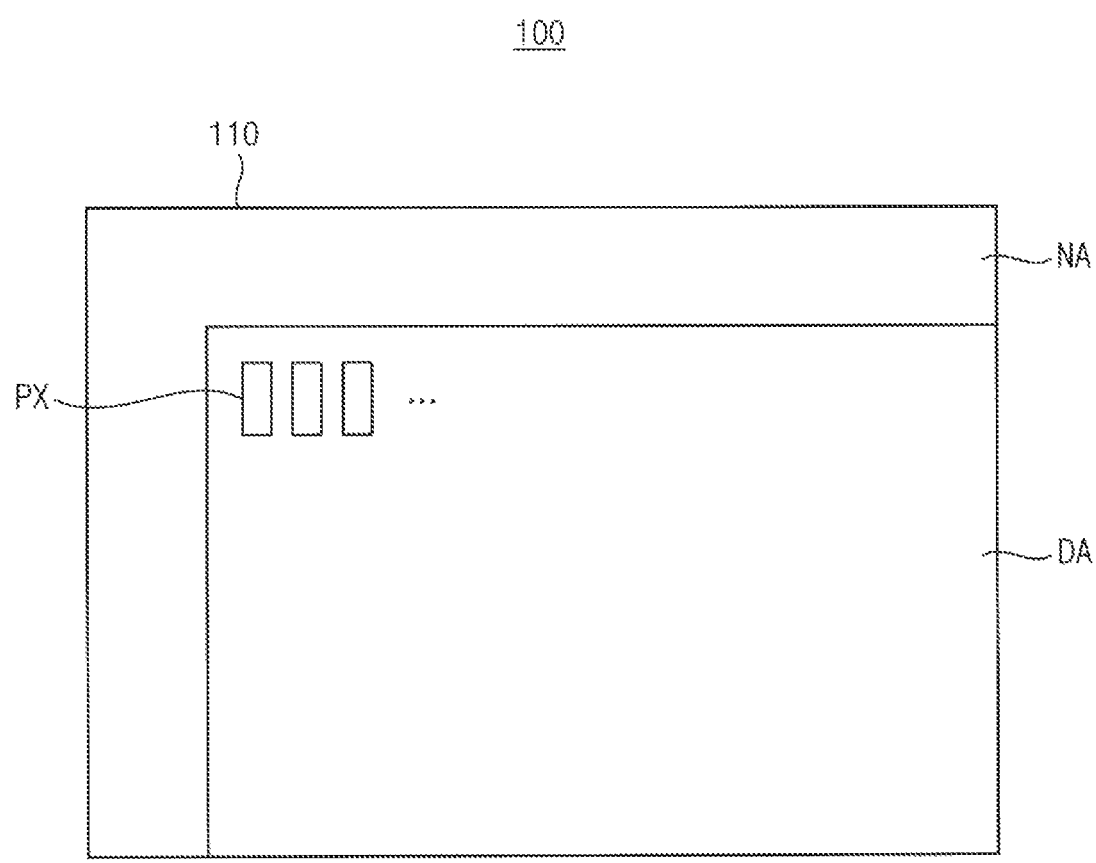
FIG. 1 is a plan view illustrating a thin-film transistor substrate according to exemplary embodiments.

FIG. 1 is a plan view illustrating a thin-film transistor substrate according to exemplary embodiments.

Referring to FIG. 1, a thin-film transistor substrate 100 according to exemplary embodiments may include a substrate 110. The substrate 110 may include a display region DA and a non-display region NA. A plurality of pixels PX may be formed in the display region DA to display an image. A driving circuit (not illustrated) may be formed in the non-display region NA to drive the plurality of pixels PX.

Figure 2:
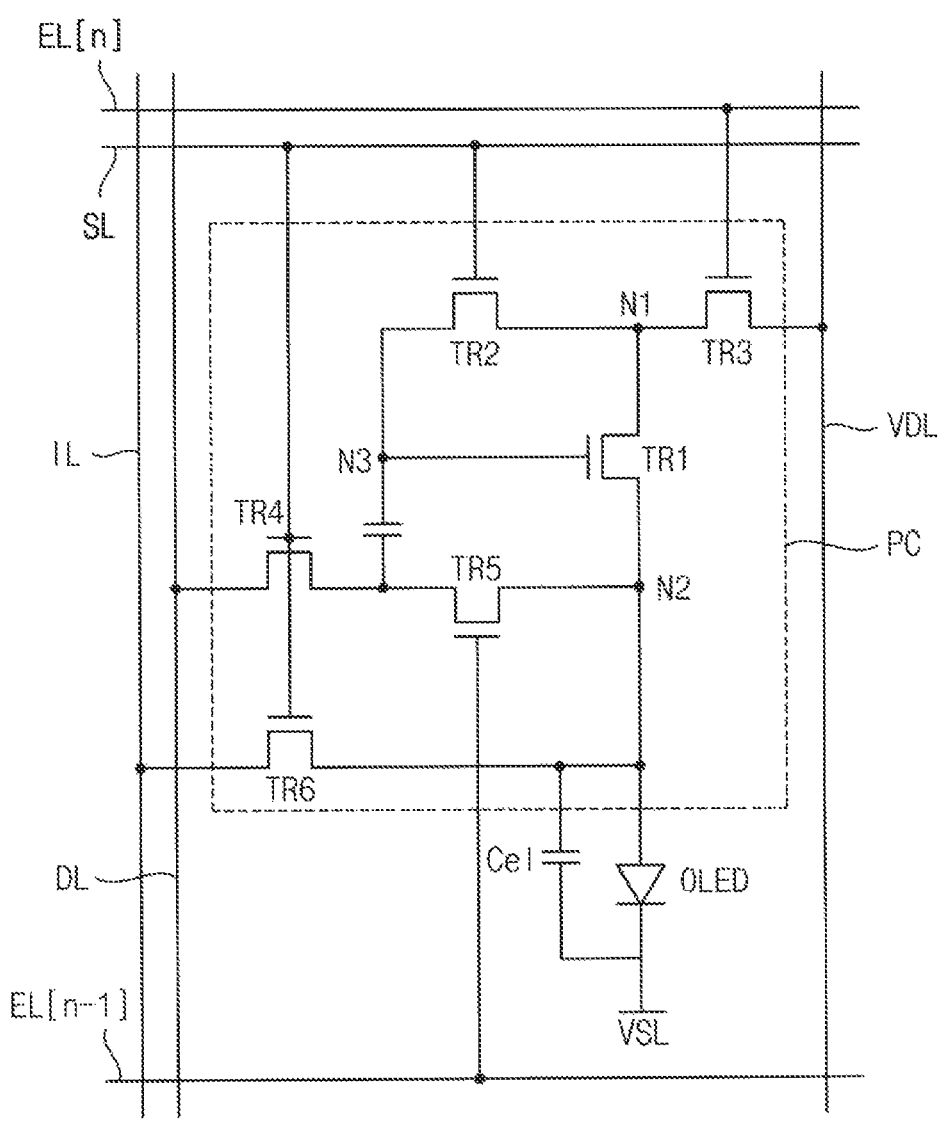
FIG. 2 is a circuit diagram illustrating a pixel of a thin-film transistor substrate according to exemplary embodiments.

FIG. 2 is a circuit diagram illustrating a pixel of a thin-film transistor substrate according to exemplary embodiments.

Referring to FIG. 2, the pixel PX of the thin-film transistor substrate 100 according to exemplary embodiments may include a pixel circuit PC and an organic light emitting element OLED. The pixel circuit PC may include at least one transistor and at least one capacitor. The pixel circuit PC may receive signals from wirings disposed in the display region DA, and may transmit a driving current to the organic light emitting element OLED. The organic light emitting element OLED may emit light having a luminance that corresponds to a level or a duration of the driving current.

In an exemplary embodiment, the pixel circuit PC may include six transistors TR1, TR2, TR3, TR4, TR5, and TR6 and one capacitor Cst. However, the present disclosure is not limited thereto, and the pixel circuit PC may include one through five, seven, or more transistors and two or more capacitors. A first transistor TR1, a second transistor TR2, a third transistor TR3, a fourth transistor TR4, a fifth transistor TR5, and a sixth transistor TR6 included in the pixel circuit PC may transmit the driving current to the organic light emitting element OLED based on signals transmitted from a data line DL, a scan line SL, an emission control line EL, an initialization voltage line IL, a driving voltage line VDL, and a common voltage line VSL. However, a structure and/or a construction of the pixel circuit PC according to exemplary embodiments is not limited to the pixel circuit PC illustrated in FIG. 2.

In an exemplary embodiment, the first transistor TR1 that corresponds to a driving transistor may include a semiconductor layer formed of polycrystalline semiconductor, and the second transistor TR2, the third transistor TR3, the fourth transistor TR4, the fifth transistor TR5, and the sixth transistor TR6 may include a semiconductor layer formed of oxide semiconductor. However, the present disclosure is not limited thereto.

The pixel circuit PC may include nodes at which source/drain electrodes of the transistors are connected to each other. For example, the pixel circuit PC may include a first node N1 at which a source/drain electrode of the first transistor TR1 and a source/drain electrode of the third transistor TR3 are connected and a second node N2 at which a source/drain electrode of the first transistor TR1 and a source/drain electrode of the fifth transistor TR5 are connected.

Hereinafter, a thin-film transistor substrate 100 according to a first exemplary embodiment will be described with reference to FIGS. 3, 4, 5A, 5B, and 5C.

Figure 3:
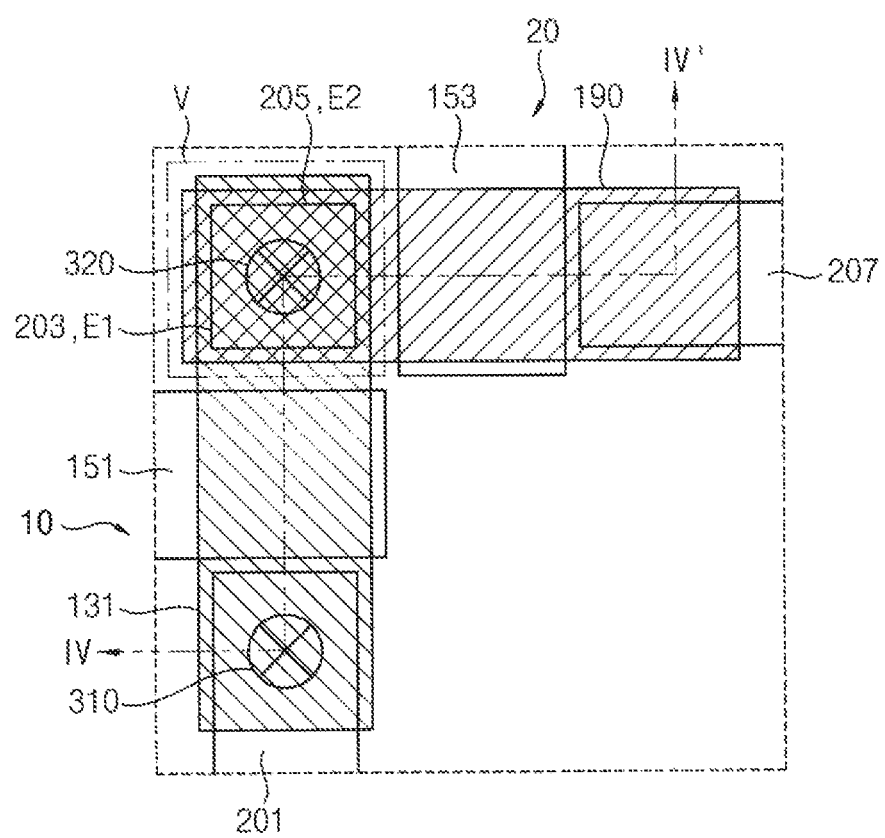
FIG. 3 is a layout view illustrating a node of a pixel circuit in FIG. 2.
Figure 4:
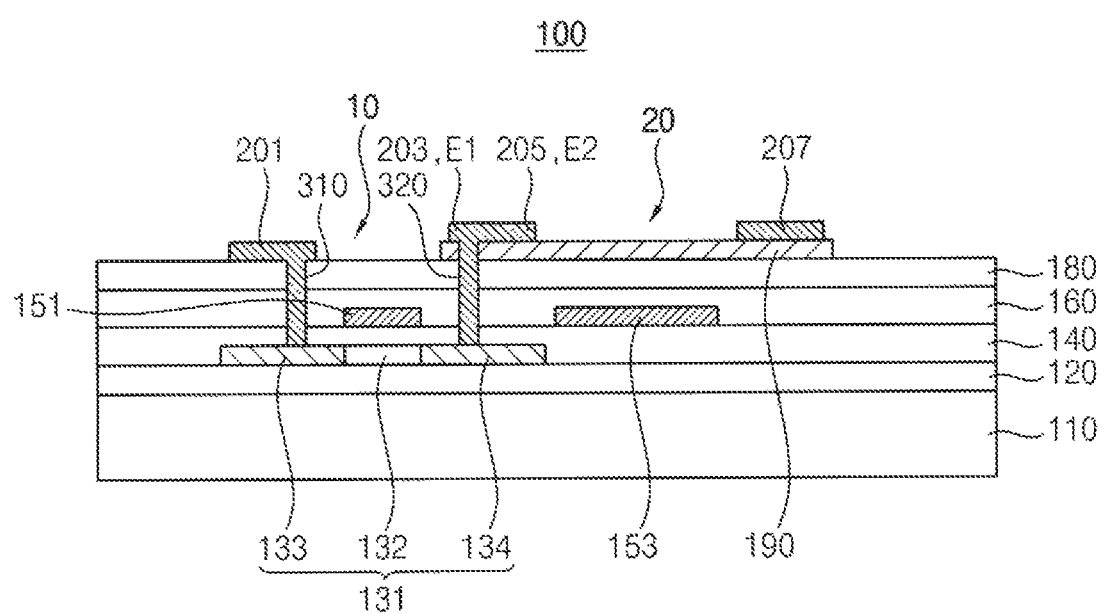
FIG. 4 is a cross-sectional view illustrating a thin-film transistor substrate according to a first exemplary embodiment.

FIG. 3 is a layout view illustrating a node of a pixel circuit in FIG. 2. FIG. 4 is a cross-sectional view illustrating a thin-film transistor substrate according to a first exemplary embodiment. For example, FIG. 3 may illustrate the first node N1 of the pixel circuit PC in FIG. 2. FIG. 4 may illustrate the thin-film transistor substrate cut along a line IV-IV' in FIG. 3.

Referring to FIGS. 3 and 4, the thin-film transistor substrate 100 according to the first exemplary embodiment may include a first thin-film transistor 10 and a second thin-film transistor 20. For example, the first thin-film transistor 10 and the second thin-film transistor 20 may correspond to the first transistor TR1 and the third transistor TR3 illustrated in FIG. 2, respectively.

The first thin-film transistor 10 may include a first semiconductor layer 131, a first gate electrode 151, and a first electrode E1. In an exemplary embodiment, the first electrode E1 may be any one of a first drain electrode 201 and a first source electrode 203 of the first thin-film transistor 10. The second thin-film transistor 20 may include a second semiconductor layer 190, a second gate electrode 153, and a second electrode E2. In an exemplary embodiment, the second electrode E2 may be any one of a second drain electrode 205 and a second source electrode 207 of the second thin-film transistor 20.

The first electrode E1 and the second electrode E2 may be electrically connected to each other. The first electrode E1 and the second electrode E2 may be overlapped with each other.

In the first exemplary embodiment, the first thin-film transistor 10 may correspond to a coplanar type thin-film transistor having a top gate structure. However, the first exemplary embodiment is not limited thereto. In the first exemplary embodiment, the second thin-film transistor 20 may correspond to an inverted staggered type thin-film transistor having a bottom gate structure.

The substrate 110 may include an insulation substrate composed of glass, quartz, ceramic, plastic, or the like. However, the first exemplary embodiment is not limited thereto, and the substrate 110 may alternatively include a metallic substrate composed of stainless steel or the like.

A buffer layer 120 may be disposed on the substrate 110. The buffer layer 120 may include at least one inorganic layer and/or organic layer. The buffer layer 120 may prevent permeation of oxygen, moisture, etc., and may planarize the top of the substrate 110. Alternatively, the buffer layer 120 may be omitted.

The first semiconductor layer 131 may be disposed on the buffer layer 120. The first semiconductor layer 131 may be formed of polycrystalline semiconductor.

The first semiconductor layer 131 may include a channel region 132, and a drain region 133 and a source region 134 which are formed on opposing sides of the channel region 132. Impurities may be doped in the drain region 133 and the source region 134, and may not be doped in the channel region 132.

The first semiconductor layer 131 may be an n-type semiconductor or a p-type semiconductor. In an exemplary embodiment, impurities doped in the drain region 133 and the source region 134 may be n-type impurities. For example, a material such as phosphorus (P) ion may be used as n-type impurities. In another exemplary embodiment, impurities doped in the drain region 133 and the source region 134 may be p-type impurities. For example, a material such as boron (B) ion may be used as p-type impurities.

A first insulation layer 140 may be disposed on the buffer layer 120. The first insulation layer 140 may cover the first semiconductor layer 131. The first insulation layer 140 may serve as a gate insulation layer that insulates the first gate electrode 151 from the first semiconductor layer 131. For example, the first insulation layer 140 may include silicon nitride (SiNx), silicon oxide (SiOx), silicon oxynitride (SiOxNy), or the like. However, a material of the first insulation layer 140 is not limited thereto.

The first gate electrode 151 and the second gate electrode 153 may be disposed on the first insulation layer 140.

The first gate electrode 151 may overlap the channel region 132 of the first semiconductor layer 131. The first gate electrode 151 may prevent impurities from being doped in the channel region 132 when the impurities are doped in the drain region 133 and the source region 134 during the formation of the first semiconductor layer 131. The second gate electrode 153 may be spaced apart from the first gate electrode 151, and may be disposed at substantially the same level as the first gate electrode 151.

The first and second gate electrodes 151 and 153 may include a conductive material. For example, the first and second gate electrodes 151 and 153 may include metal such as aluminum (Al), silver (Ag), chromium (Cr), titanium (Ti), tantalum (Ta), molybdenum (Mo), or an alloy thereof. However, materials of the first and second gate electrodes 151 and 153 are not limited thereto. In an exemplary embodiment, the first gate electrode 151 and the second gate electrode 153 may include substantially the same material.

A second insulation layer 160 and a third insulation layer 180 may be disposed on the first insulation layer 140. The second insulation layer 160 and the third insulation layer 180 may cover the first gate electrode 151 and the second gate electrode 153. The second and third insulation layers 160 and 180 may serve as an insulation layer that insulates the first drain/source electrodes 201 and 203 from the first gate electrode 151. For example, the second and third insulation layers 160 and 180 may include silicon nitride (SiNx), silicon oxide (SiOx), silicon oxynitride (SiOxNy), or the like. However, materials of the second and third insulation layers 160 and 180 are not limited thereto. Alternatively, the third insulation layer 180 may be omitted.

The second semiconductor layer 190 may be disposed on the third insulation layer 180. The second semiconductor layer 190 may overlap at least a portion of the first semiconductor layer 131. Therefore, a region in which the first thin-film transistor 10 is disposed and a region in which the second thin-film transistor 20 is disposed may be at least partially overlapped.

The second semiconductor layer 190 may be formed of oxide semiconductor. The second semiconductor layer 190 may be formed of at least one element of gallium (Ga), indium (In), zinc (Zn), and tin (Sn) and an oxide including oxygen (O). For example, the second semiconductor layer 190 may be formed of a mixed oxide such as InZnO, InGaO, InSnO, ZnSnO, GaZnO, GaInZnO, etc. The second semiconductor layer 190 may be an n-type semiconductor.

Using an oxide semiconductor for the second thin-film transistor 20 may provide the second thin-film transistor 20 with an effective charge mobility that is about two times to about one hundred times greater than that of a thin-film transistor based on amorphous silicon. Further, the second thin-film transistor 20 may have an ON/OFF current ratio of, e.g., about $10^5$ to about $10^8$. Thus, the second thin-film transistor 20 using the oxide semiconductor may exhibit superior semiconductor characteristics. Furthermore, with an oxide semiconductor, little or no optical leakage current from visible light may be generated because the band gap of the oxide semiconductor may be about 3.0 eV to about 3.5 eV. Moreover, the second semiconductor layer 190 may further contain elements of the third, fourth or fifth groups of the periodic table, or transition elements in order to improve the characteristics of the second thin-film transistor 20.

The first drain electrode 201, the first source electrode 203, the second drain electrode 205, and the second source electrode 207 may be disposed on the third insulation layer 180 and the second semiconductor layer 190. Specifically, the first drain electrode 201 that contacts the drain region 133 of the first semiconductor layer 131 through a first contact hole 310 and the first source electrode 203 that contacts the source region 134 of the first semiconductor layer 131 through a second contact hole 320 may be disposed on the third insulation layer 180. Further, the second drain electrode 205 that contacts a first region of the second semiconductor layer 190 and the second source electrode 207 that contacts a second region of the second semiconductor layer 190 which is different from the first region may be disposed on the second semiconductor layer 190.

The first contact hole 310 may pass through the first to third insulation layers 140, 160, and 180, and may expose a portion of the drain region 133 of the first semiconductor layer 131. The second contact hole 320 may pass through the first to third insulation layers 140, 160, and 180, and may expose a portion of the source region 134 of the first semiconductor layer 131.

The first drain and source electrodes 201 and 203 and the second drain and source electrodes 205 and 207 may include conductive material. For example, the first drain and source electrodes 201 and 203 and the second drain and source electrodes 205 and 207 may include metal such as aluminum (Al), silver (Ag), chromium (Cr), titanium (Ti), tantalum (Ta), molybdenum (Mo) or alloy thereof. However, materials of the first drain and source electrodes 201 and 203 and the second drain and source electrodes 205 and 207 are not limited thereto. In an exemplary embodiment, the first drain and source electrodes 201 and 203 and the second drain and source electrodes 205 and 207 may include substantially the same material.

As described above, the first electrode E1 of the first thin-film transistor 10 may be one of the first drain electrode 201 and the first source electrode 203, and the second electrode E2 of the second thin-film transistor 20 may be one of the second drain electrode 205 and the second source electrode 207. FIG. 4 illustrates that the first electrode E1 and the second electrode E2 are the first source electrode 203 and the second drain electrode 205, respectively; however, the first exemplary embodiment is not limited thereto.

The second contact hole 320 may be formed on the first semiconductor layer 131, and may pass through the second semiconductor layer 190. For example, the second contact hole 320 may be formed on the first source region 134 of the first semiconductor layer 131, and may pass through a portion of a region in the second semiconductor layer 190 which overlaps the second electrode E2. The first electrode E1 and the second electrode E2 may be disposed on the second semiconductor layer 190, and may fill the second contact hole 320 to be formed integrally. In other words, the first electrode E1 electrically connected to the first semiconductor layer 131 and the second electrode E2 electrically connected to the second semiconductor layer 190 may not be formed separately, and the first electrode E1 and the second electrode E2 may be integrally formed by filling the second contact hole 320 that passes through the second semiconductor layer 190.

FIG. 4 illustrates that the first source electrode 203, the second drain electrode 205, and the second source electrode 207 are disposed directly on the second semiconductor layer 190. However, the first exemplary embodiment is not limited thereto. A fourth insulation layer that covers the second semiconductor layer 190 may be disposed on the third insulation layer 180, and the first drain electrode 201, the first source electrode 203, the second drain electrode 205, and the second source electrode 207 may be disposed on the fourth insulation layer.

The thin-film transistor substrate 100 according to the first exemplary embodiment may include the first thin-film transistor 10 and the second thin-film transistor 20 which are at least partially overlapped with each other, and the first thin-film transistor 10 and the second thin-film transistor 20 may be electrically connected through the contact hole 320 that is vertically formed. Thus, an area occupied by the thin-film transistors may decrease.

Figure 5A:
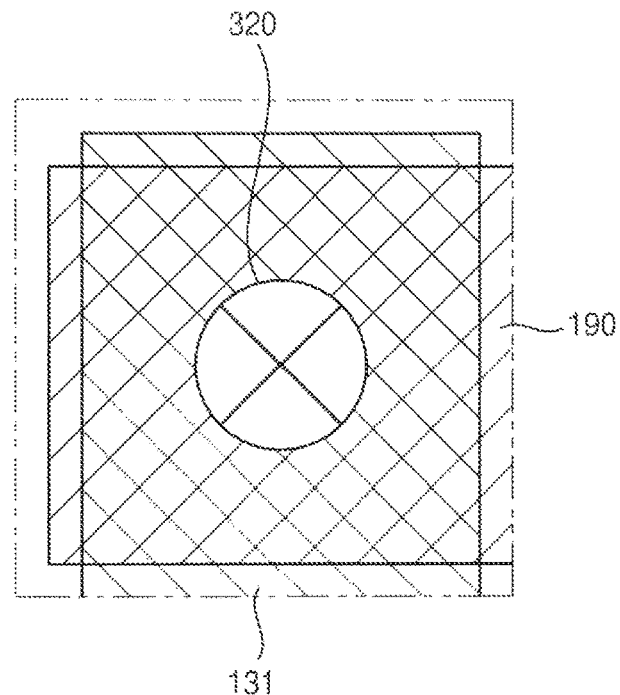
FIGS. 5A, 5B, and 5C are layout views illustrating a contact hole of a thin-film transistor substrate according to a first exemplary embodiment.
Figure 5B:
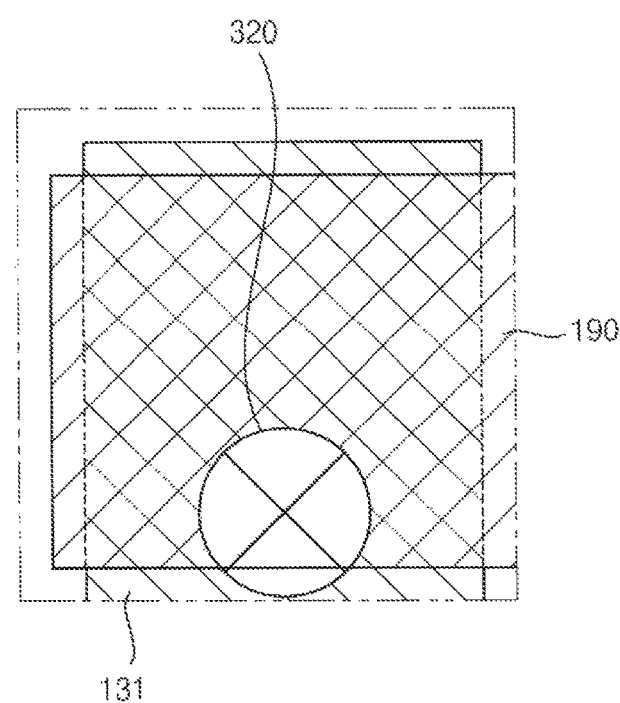
Figure 5C:
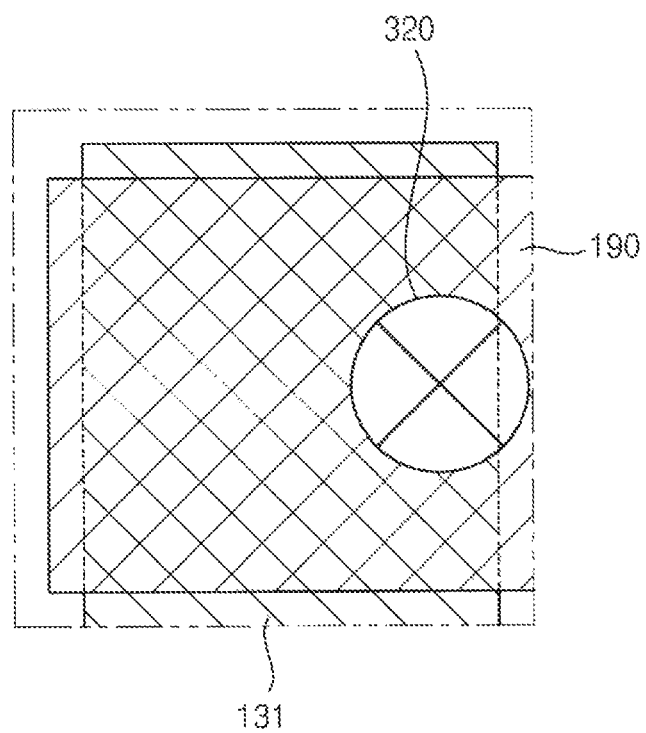

FIGS. 5A, 5B, and 5C are layout views illustrating a contact hole of a thin-film transistor substrate according to a first exemplary embodiment.

Referring to FIGS. 5A, 5B, and 5C, at least a portion of the second contact hole 320 may overlap each of the first semiconductor layer 131 and the second semiconductor layer 190.

As illustrated in FIG. 5A, in an exemplary embodiment, an entirety of the second contact hole 320 may overlap each of the first semiconductor layer 131 and the second semiconductor layer 190. In this case, a contact area between the first electrode E1 (or the second electrode E2) and the first semiconductor layer 131 and a contact area between the first electrode E1 (or the second electrode E2) and the second semiconductor layer 190 may be maximized, so that an electron mobility may increase.

As illustrated in FIG. 5B, in an exemplary embodiment, an entirety of the second contact hole 320 may overlap the first semiconductor layer 131, and a portion of the second contact hole 320 may overlap the second semiconductor layer 190. For example, some portion of the second contact hole 320 may overlap the second semiconductor layer 190, however, the other portion of the second contact hole 320 may not overlap the second semiconductor layer 190. In this case, a portion of the first electrode E1 (or the second electrode E2) may contact the second semiconductor layer 190, so that the first thin-film transistor 10 and the second thin-film transistor 20 may be electrically connected.

As illustrated in FIG. 5C, in an exemplary embodiment, an entirety of the second contact hole 320 may overlap the second semiconductor layer 190, and a portion of the second contact hole 320 may overlap the first semiconductor layer 131. For example, some portion of the second contact hole 320 may overlap the first semiconductor layer 131, however, the other portion of the second contact hole 320 may not overlap the first semiconductor layer 131. In this case, a portion of the first electrode E1 (or the second electrode E2) may contact the first semiconductor layer 131, so that the first thin-film transistor 10 and the second thin-film transistor 20 may be electrically connected.

Hereinafter, a method of manufacturing the thin-film transistor substrate according to the first exemplary embodiment will be described with reference to FIGS. 6A, 6B, 6C, 6D, 6E, and 4.

FIGS. 6A, 6B, 6C, 6D, and 6E are cross-sectional views illustrating a method of manufacturing a thin-film transistor substrate according to a first exemplary embodiment.

Figure 6A:
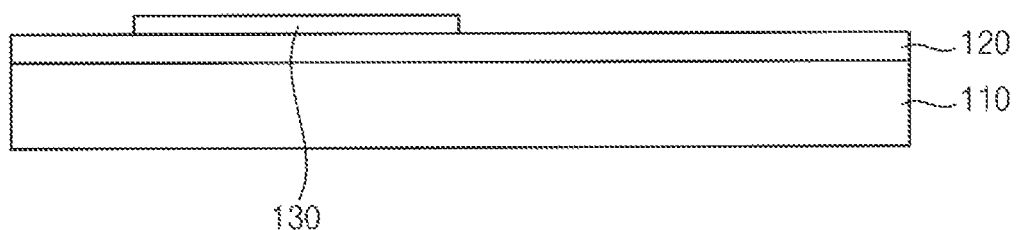
FIGS. 6A, 6B, 6C, 6D, and 6E are cross-sectional views illustrating a method of manufacturing a thin-film transistor substrate according to a first exemplary embodiment.

Referring to FIG. 6A, a first semiconductor layer intermediate 130 may be formed on the substrate 110.

The buffer layer 120 may be formed on the substrate 110. A polycrystalline semiconductor layer may be formed on the buffer layer 120. The polycrystalline semiconductor layer may be formed by e.g., forming an amorphous semiconductor layer and crystallizing the amorphous semiconductor layer. Various techniques are well known for crystallizing amorphous semiconductor layer and details thereof will be omitted. The amorphous semiconductor layer may be crystallized using e.g., heat, lasers, joule heating, an electric filed, a catalyst metal, etc. Then, the polycrystalline semiconductor layer may be patterned to form the first semiconductor layer intermediate 130.

Figure 6B:
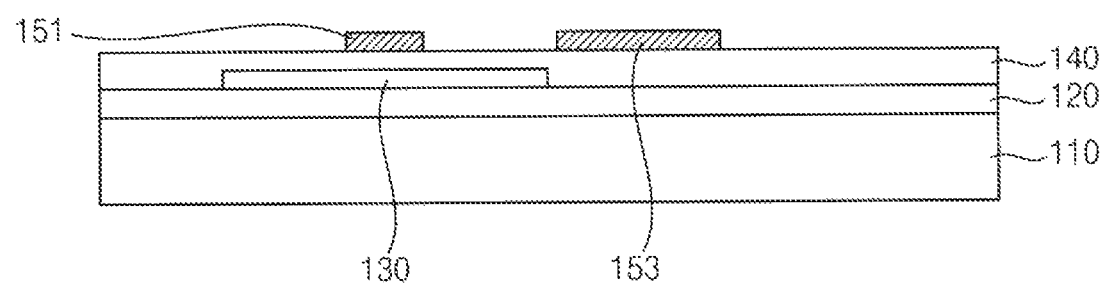

Referring to FIG. 6B, the first gate electrode 151 and the second gate electrode 153 may be formed on the first semiconductor layer intermediate 130.

The first insulation layer 140 may be formed on the buffer layer 120 to cover the first semiconductor layer intermediate 130. A first metal layer may be formed on the first insulation layer 140. Then, the first gate electrode 151 and the second gate electrode 153 may be formed by patterning the first metal layer. The first gate electrode 151 may overlap a portion of the first semiconductor layer intermediate 130. The second gate electrode 153 may be spaced apart from the first gate electrode 151. The first gate electrode 151 and the second gate electrode 153 may be formed of substantially the same material on substantially the same level over the substrate 110.

Figure 6C:
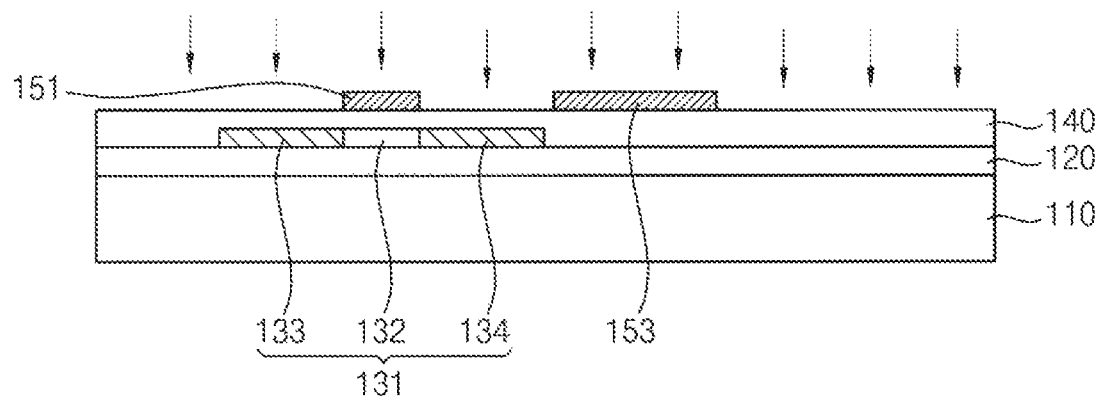

Referring to FIG. 6C, the first semiconductor layer 131 may be formed by doping impurities in the first semiconductor layer intermediate 130.

The first semiconductor layer 131 may be formed by doping impurities in the first semiconductor layer intermediate 130 from the top of the first semiconductor layer intermediate 130. The drain region 133 and the source region 134 may be formed by doping impurities at opposing sides of the first semiconductor layer 131. The channel region 132 may be formed by blocking impurities between the opposing sides of the first semiconductor layer 131. Arrows in FIG. 6C indicate doping of impurities.

Figure 6D:
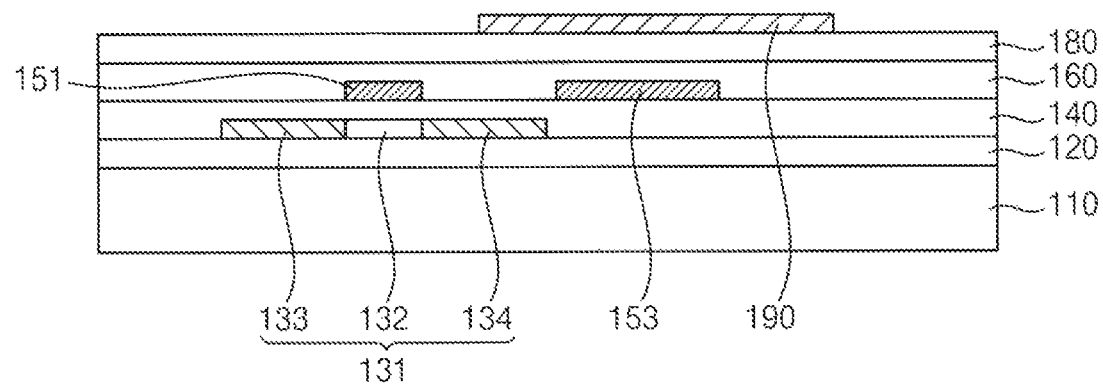

Referring to FIG. 6D, the second semiconductor layer 190 may be formed on the first semiconductor layer 131 to overlap at least a portion of the first semiconductor layer 131.

The second insulation layer 160 may be formed on the first insulation layer 140 to cover the first gate electrode 151 and the second gate electrode 153. The third insulation layer 180 may be formed on the second insulation layer 160. An oxide semiconductor layer may be formed on the third insulation layer 180. Alternatively, the third insulation layer 180 may not be formed. The oxide semiconductor layer may be formed using various suitable techniques such as physical vapor deposition (PVD), e.g., sputtering or evaporation. Then, the oxide semiconductor layer may be patterned to form the second semiconductor layer 190.

Figure 6E:
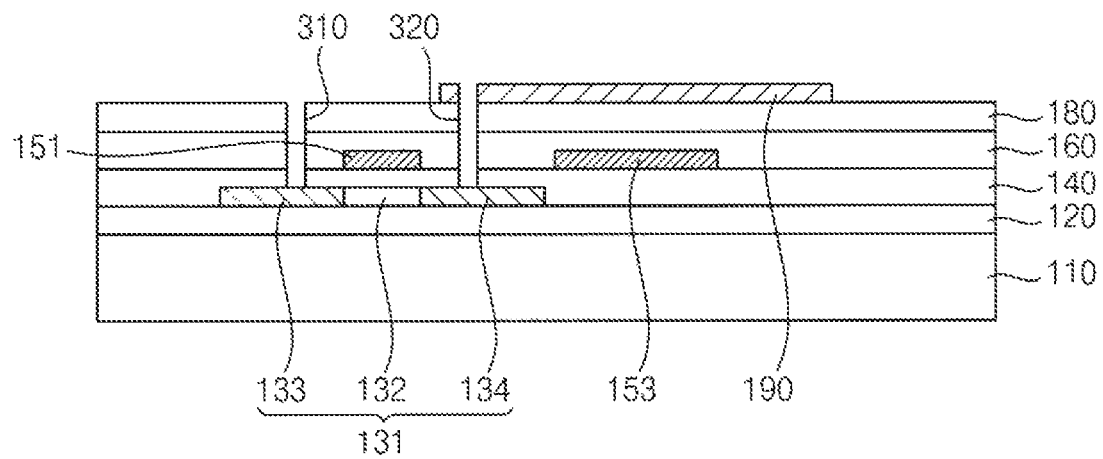

Referring to FIG. 6E, the contact hole 320 may be formed on the first semiconductor layer 131. The contact hole 320 may pass through the second semiconductor layer 190, and at least a portion of the contact hole 320 may overlap each of the first semiconductor layer 131 and the second semiconductor layer 190.

The first contact hole 310 may be formed by etching the first to third insulation layers 140, 160, and 180. The first contact hole 310 may expose a portion of the drain region 133 of the first semiconductor layer 131. The second contact hole 320 may be formed by etching the second semiconductor layer 190 and the first to third insulation layers 140, 160, and 180. The second contact hole 320 may expose a portion of the source region 134 of the first semiconductor layer 131. At least a portion of the second contact hole 320 may overlap each of the first semiconductor layer 131 and the second semiconductor layer 190. Thus, at least a portion of the first semiconductor layer 131 may be exposed by the second contact hole 320, and at least a portion of the second semiconductor layer 190 may be penetrated by the second contact hole 320.

Referring to FIG. 4, the first electrode E1 and the second electrode E2 may be integrally formed on the second semiconductor layer 190 by filling the contact hole 320.

A second metal layer may be formed on the third insulation layer 180 to cover the second semiconductor layer 190 and to fill the first and second contact holes 310 and 320. Then, the second metal layer may be patterned to form the first drain electrode 201, the first source electrode 203, the second drain electrode 205, and the second source electrode 207. The first drain electrode 201 may contact the drain region 133 of the first semiconductor layer 131 through the first contact hole 310, and the first source electrode 203 may contact the source region 134 of the first semiconductor layer 131 through the second contact hole 320. The second drain electrode 205 may contact a first region of the second semiconductor layer 190, and the second source electrode 207 may contact a second region of the second semiconductor layer 190 which is different from the first region.

As described above, the first electrode E1 of the first thin-film transistor 10 may be any one of the first drain electrode 201 and the first source electrode 203, and the second electrode E2 of the second thin-film transistor 20 may be any one of the second drain electrode 205 and the second source electrode 207. FIG. 4 illustrates that the first electrode E1 is the first source electrode 203 and the second electrode E2 is the second drain electrode 205, however, a method of manufacturing the thin-film transistor substrate according to the first exemplary embodiment is not limited thereto.

The first electrode E1 and the second electrode E2 may be disposed on the second semiconductor layer 190, and may fill the second contact hole 320 to be formed integrally. In other words, the first electrode E1 electrically connected to the first semiconductor layer 131 and the second electrode E2 electrically connected to the second semiconductor layer 190 may not be formed separately, and the first electrode E1 and the second electrode E2 may be integrally formed by filling the second contact hole 320 that passes through the second semiconductor layer 190.

Hereinafter, a thin-film transistor substrate according to a second exemplary embodiment will be described with reference to FIG. 7. Descriptions on elements of the thin-film transistor substrate according to the second exemplary embodiment which are substantially the same as or similar to elements of the thin-film transistor substrate according to the first exemplary embodiment will be omitted.

Figure 7:
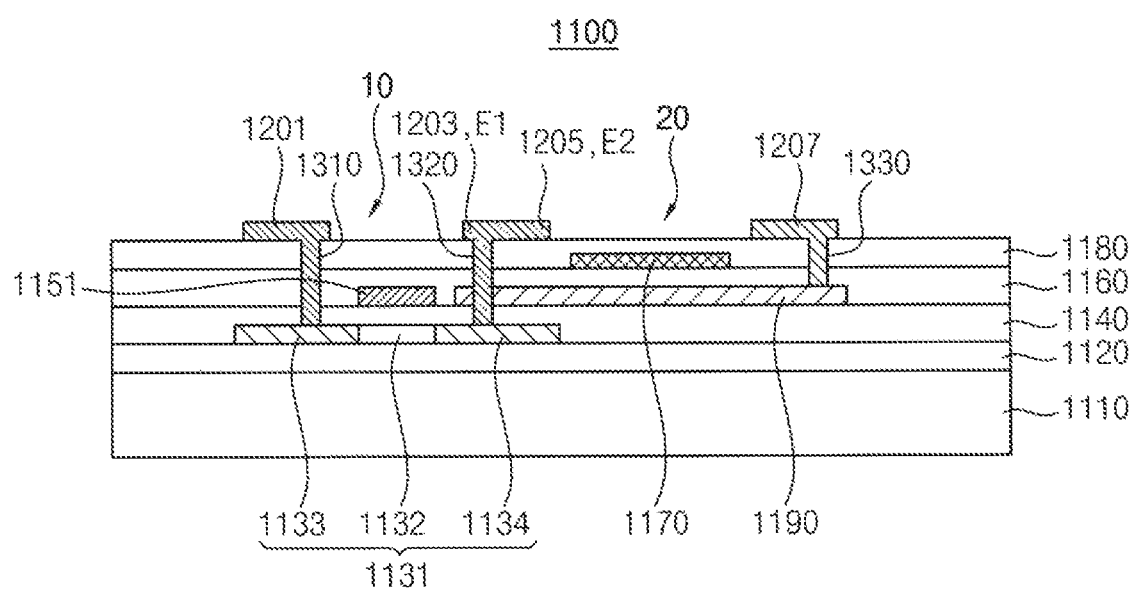
FIG. 7 is a cross-sectional view illustrating a thin-film transistor substrate according to a second exemplary embodiment.

FIG. 7 is a cross-sectional view illustrating a thin-film transistor substrate according to a second exemplary embodiment.

Referring to FIG. 7, a thin-film transistor substrate 1100 according to the second exemplary embodiment may include a first thin-film transistor 10 and a second thin-film transistor 20.

The first thin-film transistor 10 may include a first semiconductor layer 1131, a first gate electrode 1151, and a first electrode E1. In an exemplary embodiment, the first electrode E1 may be any one of a first drain electrode 1201 and a first source electrode 1203 of the first thin-film transistor 10. The second thin-film transistor 20 may include a second semiconductor layer 1190, a second gate electrode 1170, and a second electrode E2. In an exemplary embodiment, the second electrode E2 may be any one of a second drain electrode 1205 and a second source electrode 1207 of the second thin-film transistor 20.

The first electrode E1 and the second electrode E2 may be electrically connected to each other. The first electrode E1 and the second electrode E2 may overlap to each other.

In the second exemplary embodiment, the first thin-film transistor 10 may correspond to a coplanar type thin-film transistor having a top gate structure. However, the second exemplary embodiment is not limited thereto. In the second exemplary embodiment, the second thin-film transistor 20 may correspond to a coplanar type thin-film transistor having a top gate structure.

A buffer layer 1120 may be disposed on a substrate 1110. The first semiconductor layer 1131 may be disposed on the buffer layer 1120. The first semiconductor layer 1131 may be formed of polycrystalline semiconductor. The first semiconductor layer 1131 may include a channel region 1132, and a drain region 1133 and a source region 1134 which are formed opposing sides of the channel region 1132. A first insulation layer 1140 may be disposed on the buffer layer 1120. The first insulation layer 1140 may cover the first semiconductor layer 1131.

The first gate electrode 1151 and the second semiconductor layer 1190 may be disposed on the first insulation layer 1140.

The first gate electrode 1151 may overlap the channel region 1132 of the first semiconductor layer 1131. The second semiconductor layer 1190 may be spaced apart from the first gate electrode 1151, and may be disposed at substantially the same level as the first gate electrode 1151. The second semiconductor layer 1190 may overlap at least a portion of the first semiconductor layer 1131. Therefore, a region in which the first thin-film transistor 10 is disposed and a region in which the second thin-film transistor 20 is disposed may be at least partially overlapped. The second semiconductor layer 1190 may be formed of oxide semiconductor.

A second insulation layer 1160 may be disposed on the first insulation layer 1140. The second insulation layer 1160 may cover the first gate electrode 1151 and the second semiconductor layer 1190. The second insulation layer 1160 may serve as an insulation layer that insulates the first drain/source electrodes 1201 and 1203 from the first gate electrode 1151 and as a gate insulation layer that insulates a second gate electrode 1170 from the second semiconductor layer 1190.

The second gate electrode 1170 may be disposed on the second insulation layer 1160. The second gate electrode 1170 may overlap a portion of the second semiconductor layer 1190.

The second gate electrode 1170 may include a conductive material. For example, the second gate electrode 1170 may include metal such as aluminum (Al), silver (Ag), Chromium (Cr), titanium (Ti), tantalum (Ta), molybdenum (Mo), or an alloy thereof. However, a material of the second gate electrode 1170 is not limited thereto.

A third insulation layer 1180 may be disposed on the second insulation layer 1160. The third insulation layer 1180 may cover the second gate electrode 1170. The third insulation layer 1180 may serve as an insulation interlayer that insulates first drain/source electrodes 1201 and 1203 from the first gate electrode 1151 and insulates second drain/source electrodes 1205 and 1207 from the second gate electrode 1170.

The first drain electrode 1201, the first source electrode 1203, the second drain electrode 1205, and the second source electrode 1207 may be disposed on the third insulation layer 1180. The first drain electrode 1201 may contact the drain region 1133 of the first semiconductor layer 1131 through a first contact hole 1310, and the first source electrode 1203 may contact the source region 1134 of the first semiconductor layer 1131 through a second contact hole

1320. The second drain electrode 1205 may contact a first region of the second semiconductor layer 1190 through the second contact hole 1320, and the second source electrode 1207 may contact a second region of the second semiconductor layer 1190 which is different from the first region through a third contact hole 1330.

The first contact hole 1310 may pass through the first to third insulation layers 1140, 1160, and 1180, and may expose a portion of the drain region 1133 of the first semiconductor layer 1131. The second contact hole 1320 may pass through the first to third insulation layers 1140, 1160, and 1180 and the second semiconductor layer 1190, and may expose a portion of the source region 1134 of the first semiconductor layer 1131 and the first region of the second semiconductor layer 1190. The third contact hole 1330 may pass through the second and third insulation layers 1160 and 1180, and expose the second region of the second semiconductor layer 1190.

As described above, the first electrode E1 of the first thin-film transistor 10 may be one of the first drain electrode 1201 and the first source electrode 1203, and the second electrode E2 of the second thin-film transistor 20 may be one of the second drain electrode 1205 and the second source electrode 1207. FIG. 7 illustrates that the first electrode E1 and the second electrode E2 are the first source electrode 1203 and the second drain electrode 1205, respectively; however, the second exemplary embodiment is not limited thereto.

The second contact hole 1320 may be formed on the first semiconductor layer 1131, and may pass through the second semiconductor layer 1190. For example, the second contact hole 1320 may be formed on the first source region 1134 of the first semiconductor layer 1131, and may pass through a portion of a region in the second semiconductor layer 1190 which overlaps the second electrode E2. The first electrode E1 and the second electrode E2 may be disposed on the second semiconductor layer 1190, and may fill the second contact hole 1320 to be formed integrally. In other words, the first electrode E1 electrically connected to the first semiconductor layer 1131 and the second electrode E2 electrically connected to the second semiconductor layer 1190 may not be formed separately, and the first electrode E1 and the second electrode E2 may be integrally formed by filling the second contact hole 1320 that passes through the second semiconductor layer 1190.

The thin-film transistor substrate 1100 according to the second exemplary embodiment may include the first thin-film transistor 10 and the second thin-film transistor 20 which are at least partially overlapped with each other, and the first thin-film transistor 10 and the second thin-film transistor 20 may be electrically connected through the contact hole 1320 that is vertically formed. Thus, an area occupied by the thin-film transistors may decrease.

Hereinafter, a method of manufacturing a thin-film transistor substrate according to the second exemplary embodiment will be described with reference to FIGS. 8A, 8B, 8C, 8D, and 7. Descriptions on elements of the method of manufacturing the thin-film transistor substrate according to the second exemplary embodiment which are substantially the same as or similar to elements of the method of manufacturing the thin-film transistor substrate according to the first exemplary embodiment will be omitted.

FIGS. 8A, 8B, 8C, and 8D are cross-sectional views illustrating a method of manufacturing a thin-film transistor substrate according to a second exemplary embodiment.

Figure 8A:
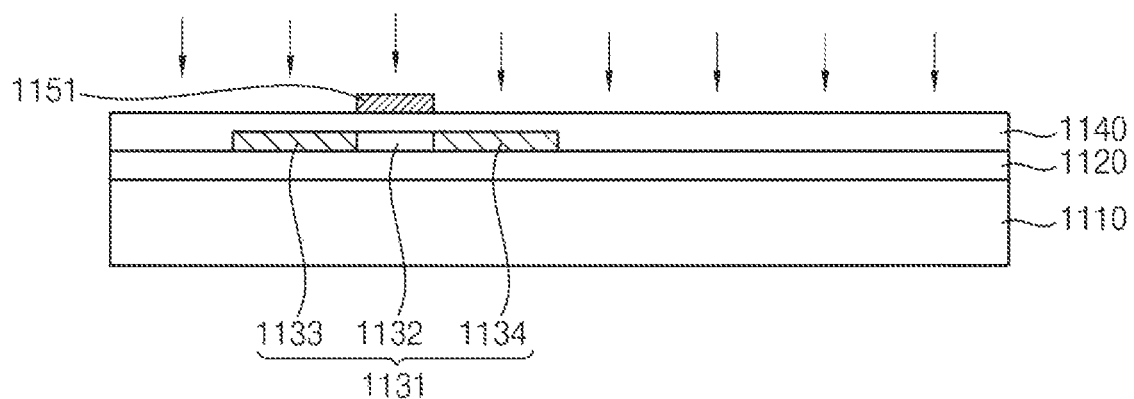
FIGS. 8A, 8B, 8C, and 8D are cross-sectional views illustrating a method of manufacturing a thin-film transistor substrate according to a second exemplary embodiment.

Referring to FIG. 8A, a first semiconductor layer intermediate may be formed on the substrate 1110. The first gate electrode 1151 may be formed on the first semiconductor layer intermediate. The first semiconductor layer 1131 may be formed by doping impurities in the first semiconductor layer intermediate.

The buffer layer 1120 may be formed on the substrate 1110. A polycrystalline semiconductor layer may be formed on the buffer layer 1120. Then, the polycrystalline semiconductor layer may be patterned to form the first semiconductor layer intermediate. The first insulation layer 1140 may be formed on the buffer layer 1120 to cover the first semiconductor layer intermediate. A first metal layer may be formed on the first insulation layer 1140. Then, the first gate electrode 1151 may be formed by patterning the first metal layer. The first gate electrode 1151 may overlap a portion of the first semiconductor layer intermediate. The first semiconductor layer 1131 may be formed by doping impurities in the first semiconductor layer intermediate from the top of the first semiconductor layer intermediate. The drain region 1133 and the source region 1134 may be formed by doping impurities at opposing sides of the first semiconductor layer 1131. The channel region 1132 may be formed by blocking impurities between the opposing sides of the first semiconductor layer 1131.

Figure 8B:
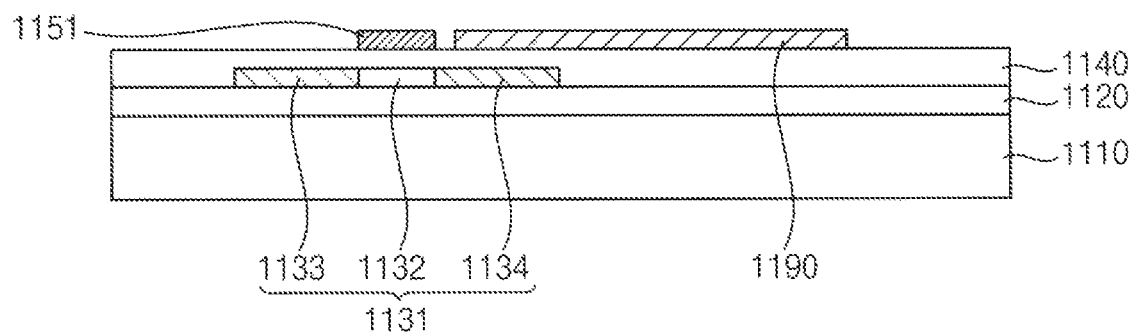

Referring to FIG. 8B, the second semiconductor layer 1190 may be formed on substantially the same level as the first gate electrode 1151 to overlap at least a portion of the first semiconductor layer 1131.

An oxide semiconductor layer may be formed on the first insulation layer 1140 to cover the first gate electrode 1151. Then, the oxide semiconductor layer may be patterned to form the second semiconductor layer 1190 on substantially the same level as the first gate electrode 1151. The second semiconductor layer 1190 may be spaced apart from the first gate electrode 1151.

Figure 8C:
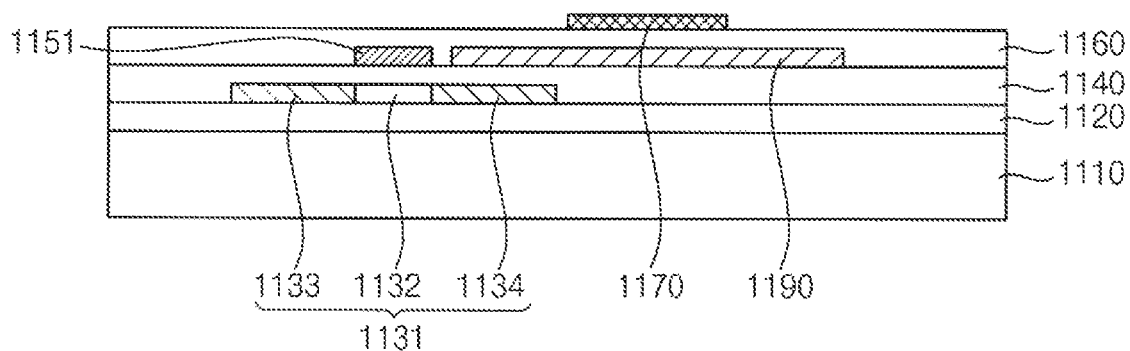

Referring to FIG. 8C, the second gate electrode 1170 may be formed on the second semiconductor layer 1190.

The second insulation layer 1160 may be formed on the first insulation layer 1140 to cover the first gate electrode 1151 and the second semiconductor layer 1190. A second metal layer may be formed on the second insulation layer 1160. Then, the second metal layer may be patterned to form the second gate electrode 1170 that overlaps a portion of the second semiconductor layer 1190.

Figure 8D:
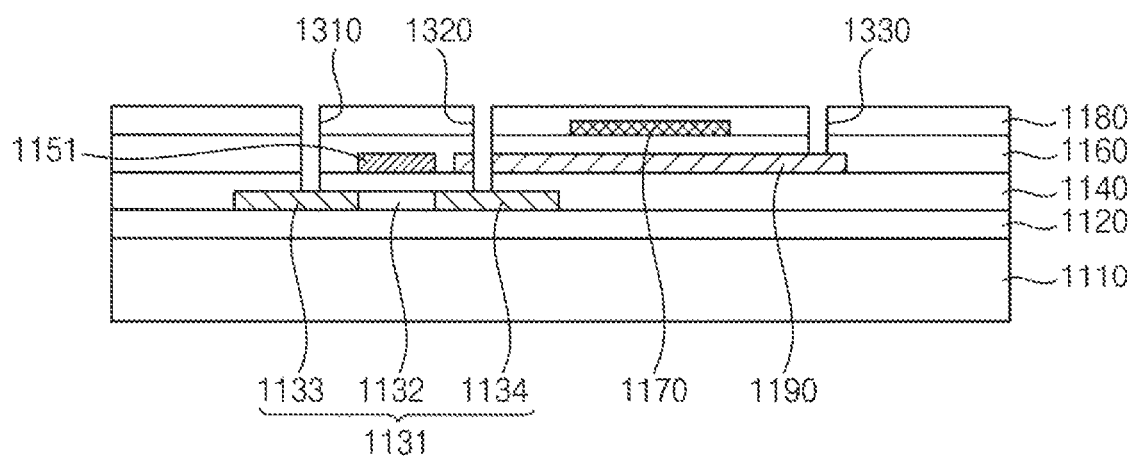

Referring to FIG. 8D, the contact hole 1320 may be formed on the first semiconductor layer 1131. The contact hole 1320 may pass through the second semiconductor layer 1190, and a portion of the contact hole 1320 may overlap each of the first semiconductor layer 1131 and the second semiconductor layer 1190.

The third insulation layer 1180 may be formed on the second insulation layer 1160 to cover the second gate electrode 1170. Then, the first contact hole 1310 may be formed by etching the first to third insulation layers 1140, 1160, and 1180. The first contact hole 1310 may expose a portion of the drain region 1133 of the first semiconductor layer 1131. The second contact hole 1320 may be formed by etching the second semiconductor layer 1190 and the first to third insulation layers 1140, 1160, and 1180. The second contact hole 1320 may expose a portion of the source region 1134 of the first semiconductor layer 1131 and a first region of the second semiconductor layer 1190. The third contact hole 1330 may be formed by etching the second and third insulation layers 1160 and 1180. The third contact hole 1330 may expose a second region of the second semiconductor layer 1190 which is different from the first region. At least a portion of the second contact hole 1320 may overlap each of the first semiconductor layer 1131 and the second semiconductor layer 1190. Thus, at least a portion of the first semiconductor layer 1131 may be exposed by the second contact hole 1320, and at least a portion of the second semiconductor layer 1190 may be penetrated by the second contact hole 1320.

Referring to FIG. 7, the first electrode E1 and the second electrode E2 may be integrally formed on the second semiconductor layer 1190 by filling the contact hole 1320.

A third metal layer may be formed on the third insulation layer 1180 to fill the first to third contact holes 1310, 1320, and 1330. Then, the third metal layer may be pattern to form the first drain electrode 1201, the first source electrode 1203, the second drain electrode 1205, and the second source electrode 1207. The first drain electrode 1201 may contact the drain region 1133 of the first semiconductor layer 1131 through the first contact hole 1310, and the first source electrode 1203 may contact the source region 1134 of the first semiconductor layer 1131 through the second contact hole 1320. The second drain electrode 1205 may contact the first region of the second semiconductor layer 1190 through the second contact hole 1320, and the second source electrode 1207 may contact the second region of the second semiconductor layer 1190 through the third contact hole 1330.

As described above, the first electrode E1 of the first thin-film transistor 10 may be any one of the first drain electrode 1201 and the first source electrode 1203, and the second electrode E2 of the second thin-film transistor 20 may be any one of the second drain electrode 1205 and the second source electrode 1207. FIG. 7 illustrates that the first electrode E1 is the first source electrode 1203 and the second electrode E2 is the second drain electrode 1205, however, a method of manufacturing the thin-film transistor substrate according to the second exemplary embodiment is not limited thereto.

The first electrode E1 and the second electrode E2 may be disposed on the second semiconductor layer 1190, and may fill the second contact hole 1320 to be formed integrally. In other words, the first electrode E1 electrically connected to the first semiconductor layer 1131 and the second electrode E2 electrically connected to the second semiconductor layer 1190 may not be formed separately, and the first electrode E1 and the second electrode E2 may be integrally formed by filling the second contact hole 1320 that passes through the second semiconductor layer 1190.

Hereinafter, a thin-film transistor substrate according to a third exemplary embodiment will be described with reference to FIG. 9. Descriptions on elements of the thin-film transistor substrate according to the third exemplary embodiment which are substantially the same as or similar to elements of the thin-film transistor substrate according to the first exemplary embodiment will be omitted.

Figure 9:
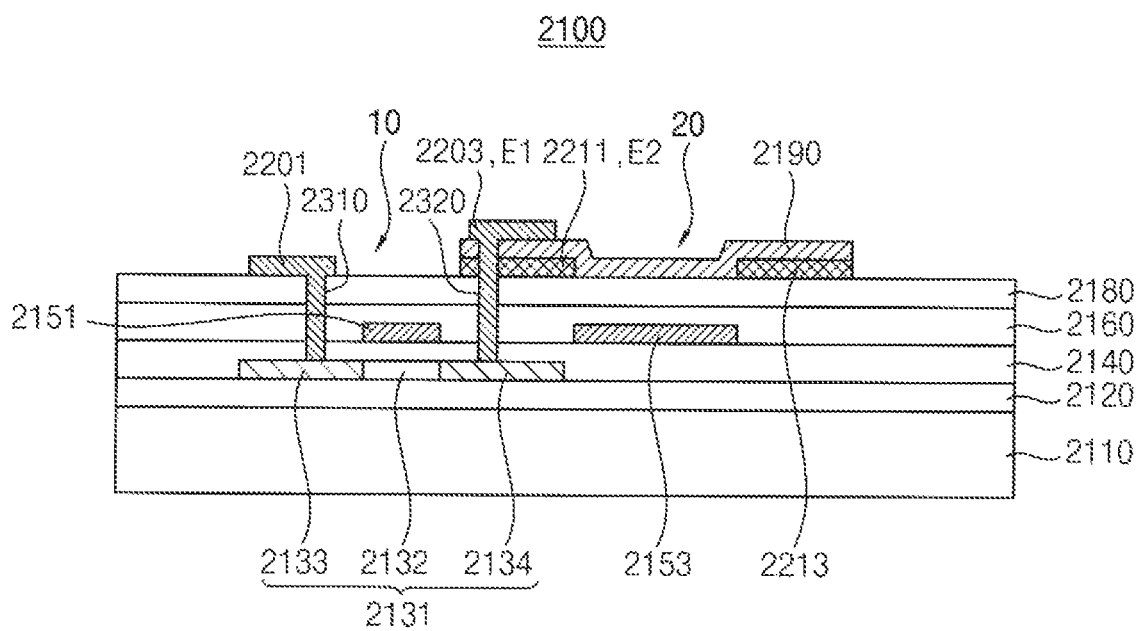
FIG. 9 is a cross-sectional view illustrating a thin-film transistor substrate according to a third exemplary embodiment.

FIG. 9 is a cross-sectional view illustrating a thin-film transistor substrate according to a third exemplary embodiment.

Referring to FIG. 9, a thin-film transistor substrate 2100 according to the third exemplary embodiment may include a first thin-film transistor 10 and a second thin-film transistor 20.

The first thin-film transistor 10 may include a first semiconductor layer 2131, a first gate electrode 2151, and a first electrode E1. In an exemplary embodiment, the first electrode E1 may be any one of a first drain electrode 2201 and a first source electrode 2203 of the first thin-film transistor 10. The second thin-film transistor 20 may include a second semiconductor layer 2190, a second gate electrode 2153, and a second electrode E2. In an exemplary embodiment, the second electrode E2 may be any one of a second drain electrode 2211 and a second source electrode 2213 of the second thin-film transistor 20.

The first electrode E1 and the second electrode E2 may be electrically connected to each other. The first electrode E1 and the second electrode E2 may overlap to each other.

In the third exemplary embodiment, the first thin-film transistor 10 may correspond to a coplanar type thin-film transistor having a top gate structure. However, the third exemplary embodiment is not limited thereto. In the third exemplary embodiment, the second thin-film transistor 20 may correspond to an inverted coplanar type thin-film transistor having a bottom gate structure.

A buffer layer 2120 may be disposed on a substrate 2110. The first semiconductor layer 2131 may be disposed on the buffer layer 2120. The first semiconductor layer 2131 may be formed of polycrystalline semiconductor. The first semiconductor layer 2131 may include a channel region 2132, and a drain region 2133 and a source region 2134 which are formed opposing sides of the channel region 2132. A first insulation layer 2140 may be disposed on the buffer layer 2120. The first insulation layer 2140 may cover the first semiconductor layer 2131. The first gate electrode 2151 and the second gate electrode 2153 may be disposed on the first insulation layer 2140. The first gate electrode 2151 may overlap the channel region 2132 of the first semiconductor layer 2131. The second gate electrode 2153 may be spaced apart from the first gate electrode 2151, and may be disposed at substantially the same level as the first gate electrode 2151. A second insulation layer 2160 and a third insulation layer 2180 may be disposed on the first insulation layer 2140. The second insulation layer 2160 and the third insulation layer 2180 may cover the first gate electrode 2151 and the second gate electrode 2153. The second and third insulation layers 2160 and 2180 may serve as an insulation interlayer that insulates the first drain/source electrodes 2201 and 2203 from the first gate electrode 2151, and may serve as a gate insulation layer that insulates the second gate electrode 2153 from the second semiconductor layer 2190.

The second drain electrode 2211 and the second source electrode 2213 may be disposed on the third insulation layer 2180. The second drain electrode 2211 and the second source electrode 2213 may be spaced apart from each other.

The second semiconductor layer 2190 may be disposed on the third insulation layer 2180. The second semiconductor layer 2190 may cover the second drain electrode 2211 and the second source electrode 2213. The second semiconductor layer 2190 may overlap at least a portion of the first semiconductor layer 2131. Therefore, a region in which the first thin-film transistor 10 is disposed and a region in which the second thin-film transistor 20 is disposed may be at least partially overlapped. At least a portion of the second semiconductor layer 2190 may overlap the second gate electrode 2153. A first region of the second semiconductor layer 2190 may contact the second drain electrode 2211, and a second region of the second semiconductor layer 2190 which is different from the first region may contact the second source electrode 2213.

FIG. 9 illustrates that the second semiconductor layer 2190 is disposed directly on the second drain electrode 2211 and the second source electrode 2213. However, the third exemplary embodiment is not limited thereto. A fourth insulation layer that covers the second drain electrode 2211 and the second source electrode 2213 may be disposed on the third insulation layer 2180, and the second semiconductor layer 2190 may be disposed on the fourth insulation layer.

The first drain electrode 2201 and the first source electrode 2203 may be disposed on the third insulation layer 2180 and the second semiconductor layer 2190. Specifically, the first drain electrode 2201 may be disposed on the third insulation layer 2180, and may contact the drain region 2133 of the first semiconductor layer 2131 through a first contact hole 2310. Further, the first source electrode 2203 may be disposed on the second semiconductor layer 2190, and may contact the source region 2134 of the first semiconductor layer 2131 through a second contact hole 2320.

The first contact hole 2310 may pass through the first to third insulation layers 2140, 2160, and 2180, and may expose a portion of the drain region 2133 of the first semiconductor layer 2131. The second contact hole 2320 may pass through the first to third insulation layers 2140, 2160, and 2180, and may expose a portion of the source region 2134 of the first semiconductor layer 2131.

As described above, the first electrode E1 of the first thin-film transistor 10 may be one of the first drain electrode 2201 and the first source electrode 2203, and the second electrode E2 of the second thin-film transistor 20 may be one of the second drain electrode 2211 and the second source electrode 2213. FIG. 9 illustrates that the first electrode E1 and the second electrode E2 are the first source electrode 2203 and the second drain electrode 2211, respectively; however, the third exemplary embodiment is not limited thereto.

The second contact hole 2320 may be formed on the first semiconductor layer 2131, and may pass through the second semiconductor layer 2190 and the second electrode E2. For example, the second contact hole 2320 may be formed on the first source region 2134 of the first semiconductor layer 2131, and may pass through a portion of a region in the second semiconductor layer 2190 which overlaps the second electrode E2 and a portion of the second electrode E2. The first electrode E1 and the second electrode E2 may be overlapped and be in contact with each other by the second contact hole 2320. In other words, the first electrode E1 may fill the second contact hole 2320 that passes through the second electrode E2, therefore, the first electrode E1 may contact the second electrode E2.

FIG. 9 illustrates that the first source electrode 2203 is disposed directly on the second semiconductor layer 2190. However, the third exemplary embodiment is not limited thereto. A fifth insulation layer that covers the second semiconductor layer 2190 may be disposed on the third insulation layer 2180, and the first drain electrode 2210 and the first source electrode 2203 may be disposed on the fifth insulation layer.

The thin-film transistor substrate 2100 according to the third exemplary embodiment may include the first thin-film transistor 10 and the second thin-film transistor 20 which are at least partially overlapped with each other, and the first thin-film transistor 10 and the second thin-film transistor 20 may be electrically connected through the contact hole 2320 that is vertically formed. Thus, an area occupied by the thin-film transistors may decrease.

Hereinafter, a method of manufacturing a thin-film transistor substrate according to the third exemplary embodiment will be described with reference to FIGS. 10A, 10B, 10C, and 9. Descriptions on elements of the method of manufacturing the thin-film transistor substrate according to the third exemplary embodiment which are substantially the same as or similar to elements of the method of manufacturing the thin-film transistor substrate according to the first exemplary embodiment will be omitted.

Figure 10A:
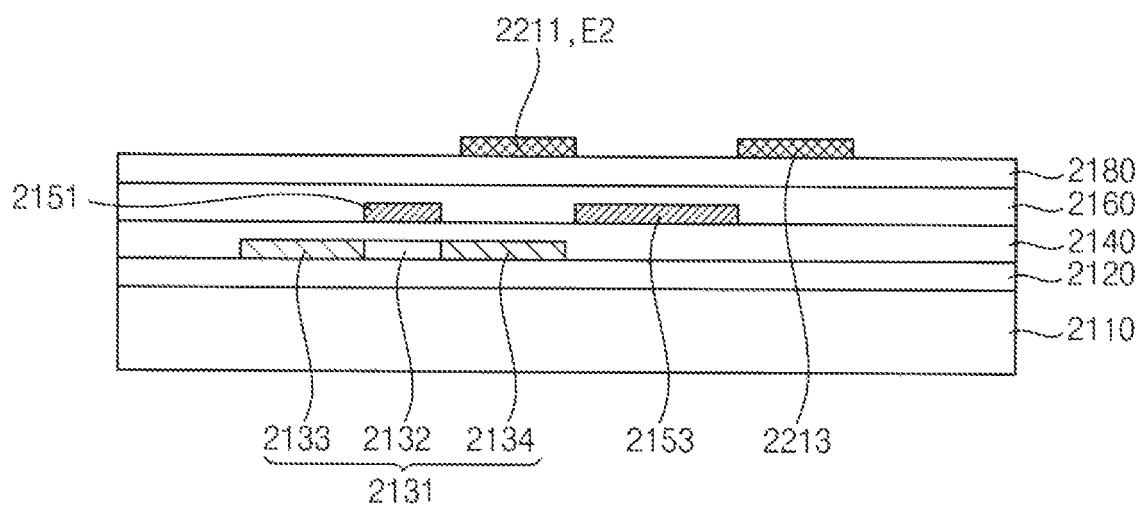
FIGS. 10A, 10B, and 10C are cross-sectional views illustrating a method of manufacturing a thin-film transistor substrate according to a third exemplary embodiment.
Figure 10B:
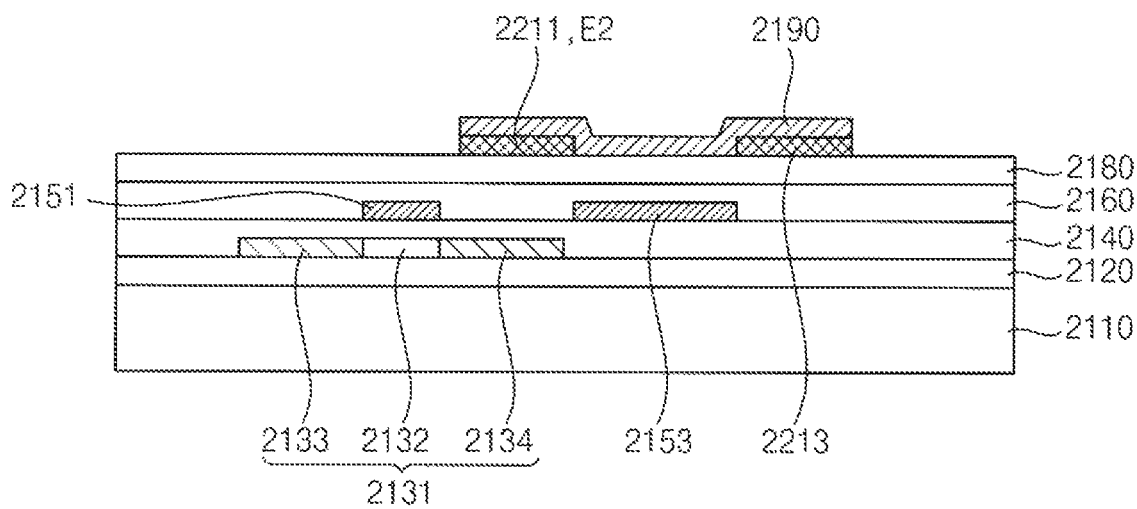
Figure 10C:
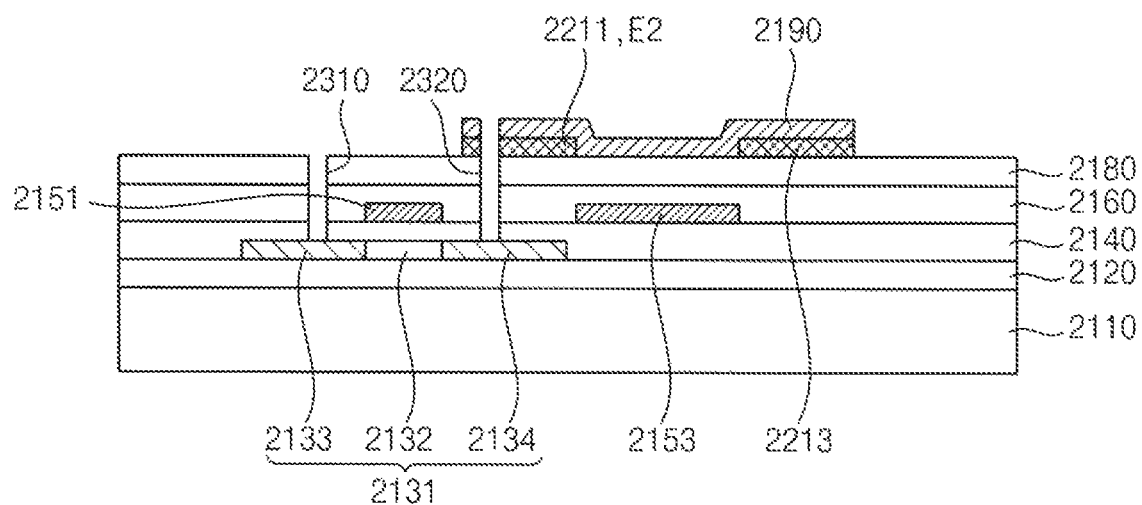

FIGS. 10A, 10B, and 10C are cross-sectional views illustrating a method of manufacturing a thin-film transistor substrate according to a third exemplary embodiment.

Referring to FIG. 10A, a first semiconductor layer intermediate may be formed on the substrate 2110. The first gate electrode 2151 and the second gate electrode 2153 may be formed on the first semiconductor layer intermediate. The first semiconductor layer 2131 may be formed by doping impurities in the first semiconductor layer intermediate. The second electrode E2 may be formed on the first semiconductor layer 2131.

The buffer layer 2120 may be formed on the substrate 2110. A polycrystalline semiconductor layer may be formed on the buffer layer 2120. Then, the polycrystalline semiconductor layer may be patterned to form the first semiconductor layer intermediate. The first insulation layer 2140 may be formed on the buffer layer 2120 to cover the first semiconductor layer intermediate. A first metal layer may be formed on the first insulation layer 2140. Then, the first gate electrode 2151 and the second gate electrode 2153 may be formed by patterning the first metal layer. The first gate electrode 2151 may overlap a portion of the first semiconductor layer intermediate. The first semiconductor layer 2131 may be formed by doping impurities in the first semiconductor layer intermediate from the top of the first semiconductor layer intermediate. The drain region 2133 and the source region 2134 may be formed by doping impurities at opposing sides of the first semiconductor layer 2131. The channel region 2132 may be formed by blocking impurities between the opposing sides of the first semiconductor layer 2131. Then, the second insulation layer 2160 and the third insulation layer 2180 may be formed on the first insulation layer 2140 to cover the first gate electrode 2151 and the second gate electrode 2153. A second metal layer may be formed on the third insulation layer 2180. Then, the second metal layer may be patterned to form the second drain electrode 2211 and the second source electrode 2213.

As described above, the second electrode E2 of the second thin-film transistor 20 may be any one of the second drain electrode 2211 and the second source electrode 2213. FIG. 10A illustrates that the second electrode E2 is the second drain electrode 2211, however, a method of manufacturing the thin-film transistor substrate according to the third exemplary embodiment is not limited thereto.

Referring to FIG. 10B, the second semiconductor layer 2190 may be formed on the second electrode E2 to overlap at least a portion of the first semiconductor layer 2131.

An oxide semiconductor layer may be formed on the third insulation layer 2180 to cover the second drain electrode 2211 and the second source electrode 2213. Then, the oxide semiconductor layer may be patterned to form the second semiconductor layer 2190. A first region of the second semiconductor layer 2190 may contact the second drain electrode 2211, and a second region of the second semiconductor layer 2190 which is different from the first region may contact the second source electrode 2213.

Referring to FIG. 10C, the contact hole 2320 may be formed on the first semiconductor layer 2131. The contact hole 2320 may pass through the second electrode E2 and the second semiconductor layer 2190, and a portion of the contact hole 2320 may overlap each of the first semiconductor layer 2131 and the second semiconductor layer 2190.

The first contact hole 2310 may be formed by etching the first to third insulation layers 2140, 2160, and 2180. The first contact hole 2310 may expose a portion of the drain region 2133 of the first semiconductor layer 2131. A second contact hole 2320 may be formed by etching the first to third insulation layers 2140, 2160, and 2180. The second contact hole 2320 may expose a portion of the source region 2134 of the first semiconductor layer 2131. At least a portion of the second contact hole 2320 may overlap each of the first semiconductor layer 2131 and the second semiconductor layer 2190. Thus, at least a portion of the first semiconductor layer 2131 may be exposed by the second contact hole 2320, and at least a portion of the second semiconductor layer 2190 may be penetrated by the second contact hole 2320.

Referring to FIG. 9, the first electrode E1 electrically connected to the second electrode E2 may be formed on the second semiconductor layer 2190 by filling the contact hole 2320.

A third metal layer may be formed on the third insulation layer 2180 to cover the second semiconductor layer 2190 and fill the first and second contact holes 2310 and 2320. Then, the third metal layer may be pattern to form the first drain electrode 2201 and the first source electrode 2203. The first drain electrode 2201 may contact the drain region 2133 of the first semiconductor layer 2131 through the first contact hole 2310, and the first source electrode 2203 may contact the source region 2134 of the first semiconductor layer 2131 through the second contact hole 2320.

As described above, the first electrode E1 of the first thin-film transistor 10 may be any one of the first drain electrode 2201 and the first source electrode 2203. FIG. 9 illustrates that the first electrode E1 is the first source electrode 2203, however, a method of manufacturing the thin-film transistor substrate according to the third exemplary embodiment is not limited thereto.

The first electrode E1 disposed on the second semiconductor layer 2190 may be in contact with the second electrode E2 by filling the second contact hole 2320. In other words, the first electrode E1 may fill the second contact hole 2320 that passes through the second electrode E2, therefore, the first electrode E1 may contact the second electrode E2.

Hereinafter, a thin-film transistor substrate according to a fourth exemplary embodiment will be described with reference to FIG. 11. Descriptions on elements of the thin-film transistor substrate according to the fourth exemplary embodiment which are substantially the same as or similar to elements of the thin-film transistor substrate according to the third exemplary embodiment will be omitted.

Figure 11:
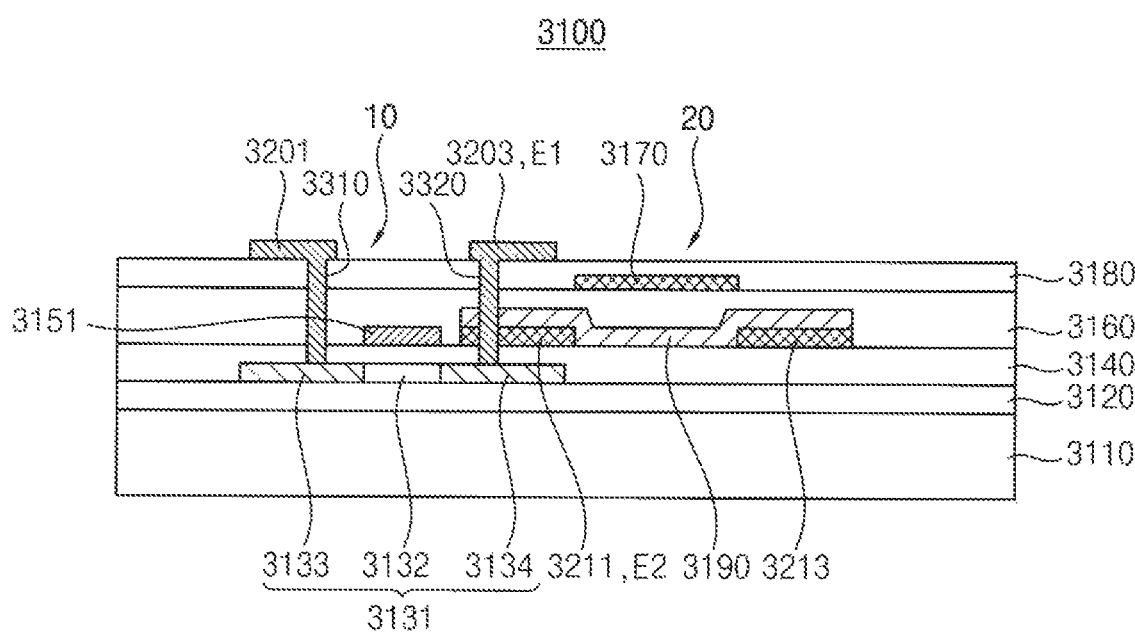
FIG. 11 is a cross-sectional view illustrating a thin-film transistor substrate according to a fourth exemplary embodiment.

FIG. 11 is a cross-sectional view illustrating a thin-film transistor substrate according to a fourth exemplary embodiment.

Referring to FIG. 11, a thin-film transistor substrate 3100 according to the fourth exemplary embodiment may include a first thin-film transistor 10 and a second thin-film transistor 20.

The first thin-film transistor 10 may include a first semiconductor layer 3131, a first gate electrode 3151, and a first electrode E1. In an exemplary embodiment, the first electrode E1 may be any one of a first drain electrode 3201 and a first source electrode 3203 of the first thin-film transistor 10. The second thin-film transistor 20 may include a second semiconductor layer 3190, a second gate electrode 3170, and a second electrode E2. In an exemplary embodiment, the second electrode E2 may be any one of a second drain electrode 3211 and a second source electrode 3213 of the second thin-film transistor 20.

The first electrode E1 and the second electrode E2 may be electrically connected to each other. The first electrode E1 and the second electrode E2 may overlap to each other.

In the fourth exemplary embodiment, the first thin-film transistor 10 may correspond to a coplanar type thin-film transistor having a top gate structure. However, the fourth exemplary embodiment is not limited thereto. In the fourth exemplary embodiment, the second thin-film transistor 20 may correspond to a staggered type thin-film transistor having a top gate structure.

A buffer layer 3120 may be disposed on a substrate 3110. The first semiconductor layer 3131 may be disposed on the buffer layer 3120. The first semiconductor layer 3131 may be formed of polycrystalline semiconductor. The first semiconductor layer 3131 may include a channel region 3132, and a drain region 3133 and a source region 3134 which are formed opposing sides of the channel region 3132. A first insulation layer 3140 may be disposed on the buffer layer 3120. The first insulation layer 3140 may cover the first semiconductor layer 3131.

The first gate electrode 3151, the second drain electrode 3211, and the second source electrode 3213 may be disposed on the first insulation layer 3140.

The first gate electrode 3151 may overlap the channel region 3132 of the first semiconductor layer 3131. The second drain electrode 3211 and the second source electrode 3213 may be spaced apart from the first gate electrode 3151, and may be disposed at substantially the same level as the first gate electrode 3151. The second drain electrode 3211 and the second source electrode 3213 may be spaced apart from each other.

The second semiconductor layer 3190 may be disposed on the first insulation layer 3140. The second semiconductor layer 3190 may cover the second drain electrode 3211 and the second source electrode 3213. The second semiconductor layer 3190 may overlap at least a portion of the first semiconductor layer 3131. Therefore, a region in which the first thin-film transistor 10 is disposed and a region in which the second thin-film transistor 20 is disposed may be at least partially overlapped. Further, a first region of the second semiconductor layer 3190 may contact the second drain electrode 3211, and a second region of the second semiconductor layer 3190 which is different from the first region may contact the second source electrode 3213.

FIG. 11 illustrates that the second semiconductor layer 3190 is disposed directly on the second drain electrode 3211 and the second source electrode 3213. However, the fourth exemplary embodiment is not limited thereto. An additional insulation layer that covers the second drain electrode 3211 and the second source electrode 3213 may be disposed on the first insulation layer 3140, and the second semiconductor layer 3190 may be disposed on the additional insulation layer.

A second insulation layer 3160 may be disposed on the first insulation layer 3140. The second insulation layer 3160 may cover the first gate electrode 3151 and the second semiconductor layer 3190. The second insulation layer 3160 may serve as an insulation interlayer that insulates the first drain/source electrodes 3201 and 3203 from the first gate electrode 3151, and may serve as a gate insulation layer that insulates the second gate electrode 3170 from the second semiconductor layer 3190.

The second gate electrode 3170 may be disposed on the second insulation layer 3160. The second gate electrode 3170 may overlap at least a portion of the second semiconductor layer 3190.

A third insulation layer 3180 may be disposed on the second insulation layer 3160. The third insulation layer 3180 may cover the second gate electrode 3170. The third insulation layer 3180 may serve as an insulation interlayer that insulates the first drain/source electrodes 3201 and 3203 from the first gate electrode 3151.

The first drain electrode 3201 and the first source electrode 3203 may be disposed on the third insulation layer 3180. Specifically, the first drain electrode 3201 may be disposed on the third insulation layer 3180, and may contact the drain region 3133 of the first semiconductor layer 3131 through a first contact hole 3310. Further, the first source electrode 3203 may be disposed on the third insulation layer 3180, and may contact the source region 3134 of the first semiconductor layer 3131 through a second contact hole 3320.

The first contact hole 3310 may pass through the first to third insulation layers 3140, 3160, and 3180, and may expose a portion of the drain region 3133 of the first semiconductor layer 3131. The second contact hole 3320 may pass through the first to third insulation layers 3140, 3160, and 3180, and may expose a portion of the source region 3134 of the first semiconductor layer 3131.

As described above, the first electrode E1 of the first thin-film transistor 10 may be one of the first drain electrode 3201 and the first source electrode 3203, and the second electrode E2 of the second thin-film transistor 20 may be one of the second drain electrode 3211 and the second source electrode 3213. FIG. 11 illustrates that the first electrode E1 and the second electrode E2 are the first source electrode 3203 and the second drain electrode 3211, respectively; however, the fourth exemplary embodiment is not limited thereto.

The second contact hole 3320 may be formed on the first semiconductor layer 3131, and may pass through the second semiconductor layer 3190 and the second electrode E2. For example, the second contact hole 3320 may be formed on the first source region 3134 of the first semiconductor layer 3131, and may pass through a portion of a region in the second semiconductor layer 3190 which overlaps the second electrode E2 and a portion of the second electrode E2. The first electrode E1 and the second electrode E2 may be overlapped and be in contact with each other by the second contact hole 3320. In other words, the first electrode E1 may fill the second contact hole 3320 that passes through the second electrode E2, therefore, the first electrode E1 may contact the second electrode E2.

The thin-film transistor substrate 3100 according to the fourth exemplary embodiment may include the first thin-film transistor 10 and the second thin-film transistor 20 which are at least partially overlapped with each other, and the first thin-film transistor 10 and the second thin-film transistor 20 may be electrically connected through the contact hole 3320 that is vertically formed. Thus, an area occupied by the thin-film transistors may decrease.

Hereinafter, a method of manufacturing a thin-film transistor substrate according to the fourth exemplary embodiment will be described with reference to FIGS. 12A, 12B, 12C, 12D, and 11. Descriptions on elements of the method of manufacturing the thin-film transistor substrate according to the fourth exemplary embodiment which are substantially the same as or similar to elements of the method of manufacturing the thin-film transistor substrate according to the third exemplary embodiment will be omitted.

FIGS. 12A, 12B, 12C, and 12D are cross-sectional views illustrating a method of manufacturing a thin-film transistor substrate according to a fourth exemplary embodiment.

Figure 12A:
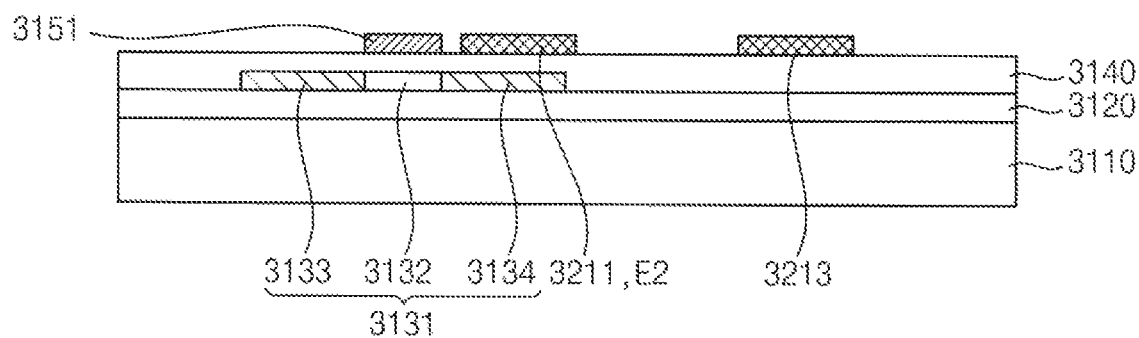
FIGS. 12A, 12B, 12C, and 12D are cross-sectional views illustrating a method of manufacturing a thin-film transistor substrate according to a fourth exemplary embodiment.

Referring to FIG. 12A, a first semiconductor layer intermediate may be formed on the substrate 3110. The first gate electrode 3151 may be formed on the first semiconductor layer intermediate. The first semiconductor layer 3131 may be formed by doping impurities in the first semiconductor layer intermediate. The second electrode E2 may be formed on the first semiconductor layer 3131 at substantially the same level as the first gate electrode 3151.

The buffer layer 3120 may be formed on the substrate 3110. A polycrystalline semiconductor layer may be formed on the buffer layer 3120. Then, the polycrystalline semiconductor layer may be patterned to form the first semiconductor layer intermediate. The first insulation layer 3140 may be formed on the buffer layer 3120 to cover the first semiconductor layer intermediate. A first metal layer may be formed on the first insulation layer 3140. Then, the first gate electrode 3151 may be formed by patterning the first metal layer. The first gate electrode 3151 may overlap a portion of the first semiconductor layer intermediate. The first semiconductor layer 3131 may be formed by doping impurities in the first semiconductor layer intermediate from the top of the first semiconductor layer intermediate. The drain region 3133 and the source region 3134 may be formed by doping impurities at opposing sides of the first semiconductor layer 3131. The channel region 3132 may be formed by blocking impurities between the opposing sides of the first semiconductor layer 3131. A second metal layer may be formed on the first insulation layer 3140 to cover the first gate electrode 3151. Then, the second metal layer may be patterned to form the second drain electrode 3211 and the second source electrode 3213 at substantially the same level as the first gate electrode 3151.

As described above, the second electrode E2 of the second thin-film transistor 20 may be any one of the second drain electrode 3211 and the second source electrode 3213. FIG. 12A illustrates that the second electrode E2 is the second drain electrode 3211, however, a method of manufacturing the thin-film transistor substrate according to the fourth exemplary embodiment is not limited thereto.

Figure 12B:
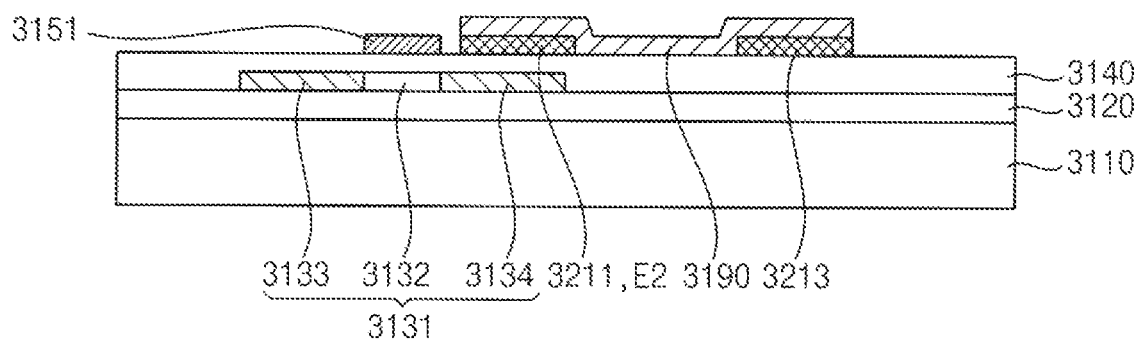

Referring to FIG. 12B, the second semiconductor layer 3190 may be formed on the second electrode E2 to overlap at least a portion of the first semiconductor layer 3131.

An oxide semiconductor layer may be formed on the first insulation layer 3140 to cover the second drain electrode 3211 and the second source electrode 3213. Then, the oxide semiconductor layer may be patterned to form the second semiconductor layer 3190. A first region of the second semiconductor layer 3190 may contact the second drain electrode 3211, and a second region of the second semiconductor layer 3190 which is different from the first region may contact the second source electrode 3213.

Figure 12C:
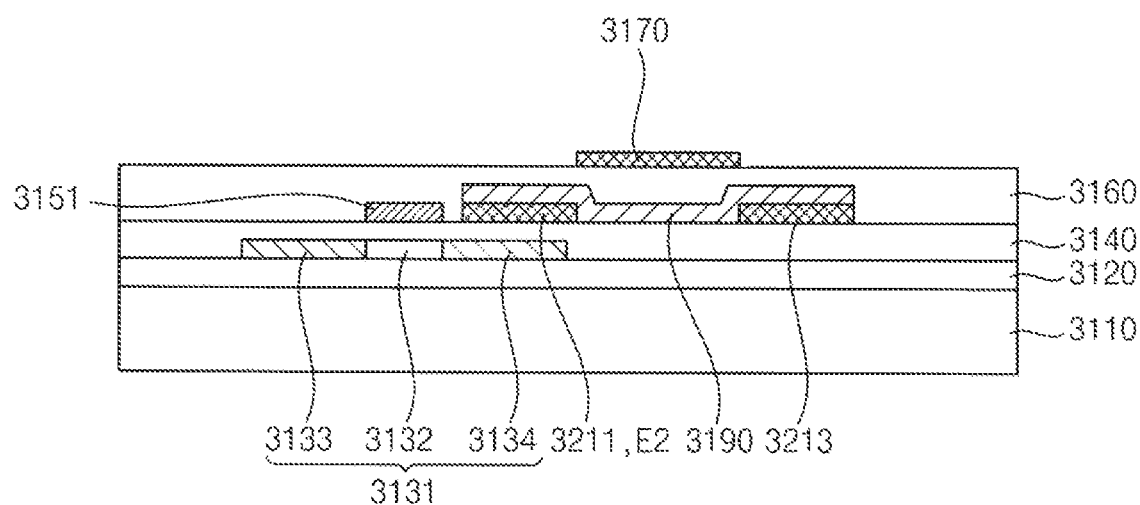

Referring to FIG. 12C, the second gate electrode 3170 may be formed on the second semiconductor layer 3190.

The second insulation layer 3160 may be formed on the first insulation layer 3140 to cover the first gate electrode 3151 and the second semiconductor layer 3190. A third metal layer may be formed on the second insulation layer 3160. Then, the third metal layer may be patterned to form the second gate electrode 3170 that overlaps a portion of the second semiconductor layer 3190.

Figure 12D:
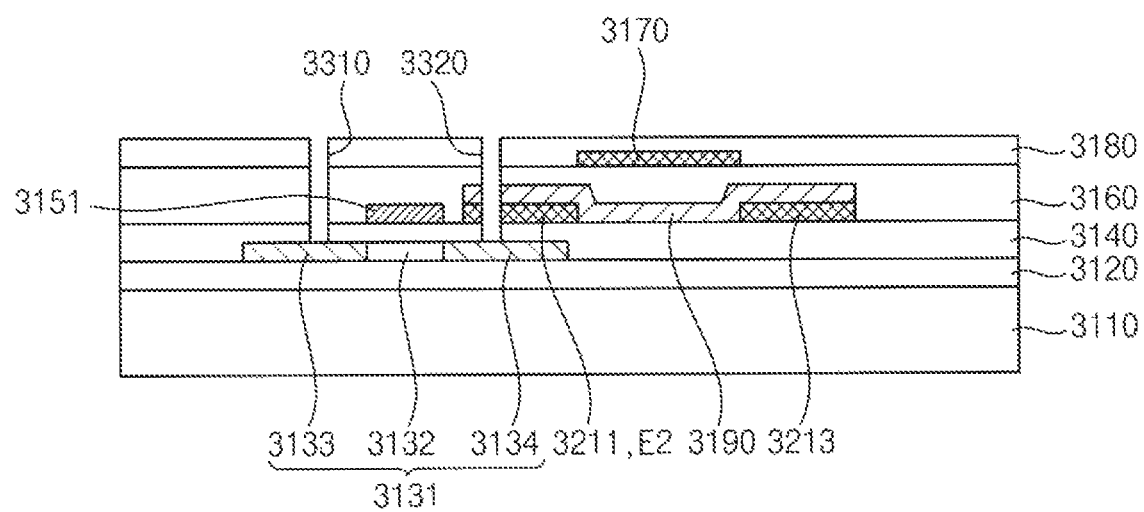

Referring to FIG. 12D, the contact hole 3320 may be formed on the first semiconductor layer 3131. The contact hole 3320 may pass through the second semiconductor layer 3190, and a portion of the contact hole 3320 may overlap each of the first semiconductor layer 3131 and the second semiconductor layer 3190.

The third insulation layer 3180 may be formed on the second insulation layer 3160 to cover the second gate electrode 3170. Then, the first contact hole 3310 may be formed by etching the first to third insulation layers 3140, 3160, and 3180. The first contact hole 3310 may expose a portion of the drain region 3133 of the first semiconductor layer 3131. The second contact hole 3320 may be formed by etching the second semiconductor layer 3190, the second drain electrode 3211, and the first to third insulation layers 3140, 3160, and 3180. The second contact hole 3320 may expose a portion of the source region 3134 of the first semiconductor layer 3131. At least a portion of the second contact hole 3320 may overlap each of the first semiconductor layer 3131 and the second semiconductor layer 3190. Thus, at least a portion of the first semiconductor layer 3131 may be exposed by the second contact hole 3320, and at least a portion of the second semiconductor layer 3190 may be penetrated by the second contact hole 3320.

Referring to FIG. 11, the first electrode E1 electrically connected to the second electrode E2 may be formed on the second semiconductor layer 3190 by filling the contact hole 3320.

A fourth metal layer may be formed on the third insulation layer 3180 to fill the first and second contact holes 3310 and 3320. Then, the fourth metal layer may be patterned to form the first drain electrode 3201 and the first source electrode 3203. The first drain electrode 3201 may contact the drain region 3133 of the first semiconductor layer 3131 through the first contact hole 3310, and the first source electrode 3203 may contact the source region 3134 of the first semiconductor layer 3131 through the second contact hole 3320.

As described above, the first electrode E1 of the first thin-film transistor 10 may be any one of the first drain electrode 3201 and the first source electrode 3203. FIG. 11 illustrates that the first electrode E1 is the first source electrode 3203, however, a method of manufacturing the thin-film transistor substrate according to the fourth exemplary embodiment is not limited thereto.

The first electrode E1 may be in contact with the second electrode E2 by filling the second contact hole 3320 disposed on the second semiconductor layer 3190. In other words, the first electrode E1 may fill the second contact hole 3320 that passes through the second electrode E2, therefore, the first electrode E1 may contact the second electrode E2.

Figure 13:
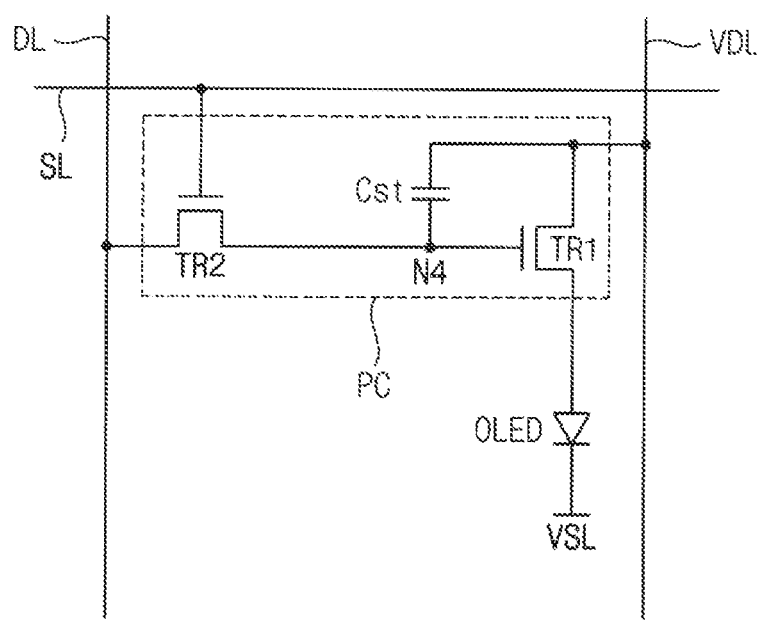
FIG. 13 is a circuit diagram illustrating a pixel of a thin-film transistor substrate according to some exemplary embodiments.

FIG. 13 is a circuit diagram illustrating a pixel of a thin-film transistor substrate according to some exemplary embodiments.

Referring to FIG. 13, the pixel PX according to some exemplary embodiments may include a pixel circuit PC and an organic light emitting element OLED. The pixel circuit PC may include at least one transistor and at least one capacitor. The pixel circuit PC may receive signals from wirings disposed in the display region DA, and may transmit a driving current to the organic light emitting element OLED. The organic light emitting element OLED may emit light having a luminance that correspond to a level or a duration of the driving current.

In an exemplary embodiment, the pixel circuit PC may include two transistors TR1 and TR2 and one capacitor Cst. However, the present disclosure is not limited thereto, and the pixel circuit PC may include one, three, or more transistors and two or more capacitors. A first transistor TR1 and a second transistor TR2 included in the pixel circuit PC may transmit the driving current to the organic light emitting element OLED based on the signals transmitted from a data line DL, a scan line SL, a driving voltage line VDL, and a common voltage line VSL. However, a structure and/or a construction of the pixel circuit PC according to some exemplary embodiments is not limited to the pixel circuit PC illustrated in FIG. 13.

In an exemplary embodiment, the first transistor TR1 that corresponds to a driving transistor may include a semiconductor layer formed of polycrystalline semiconductor, and the second transistor TR2 that corresponds to a switching transistor may include a semiconductor layer formed of oxide semiconductor. However, the present disclosure is not limited thereto.

The pixel circuit PC may include nodes at which a gate electrode of a transistor and a source/drain electrode of a transistor are connected to each other. For example, the pixel circuit PC may include a fourth node N4 at which a gate electrode of the first transistor TR1 and a source/drain electrode of the second transistor TR2 are connected to each other. Moreover, as illustrated in FIG. 2, the pixel circuit PC included in the pixel PX according to exemplary embodiments may include a third node N3 at which a gate electrode of the first transistor TR1 and a source/drain electrode of the second transistor TR2 are connected to each other.

Hereinafter, a thin-film transistor substrate according to a fifth exemplary embodiment will be described with reference to FIGS. 14 and 15. Descriptions on elements of the thin-film transistor substrate according to the fifth exemplary embodiment which are substantially the same as or similar to elements of the thin-film transistor substrate according to the first exemplary embodiment will be omitted.

Figure 14:
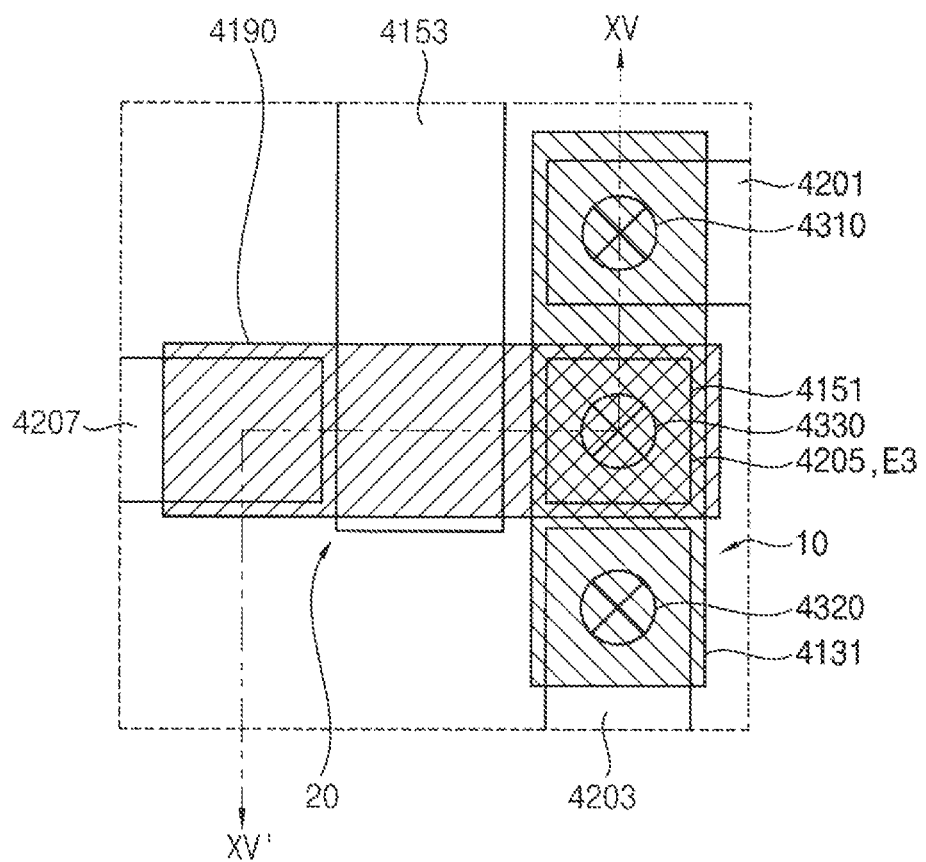
FIG. 14 is a layout view illustrating a node of a pixel circuit in FIG. 13.

FIG. 14 is a layout view illustrating a node of a pixel circuit in FIG. 13. FIG. 15 is a cross-sectional view illustrating a thin-film transistor substrate according to a fifth exemplary embodiment. For example, FIG. 14 may illustrate the first node N4 of the pixel circuit PC in FIG. 13. FIG. 15 may illustrate the thin-film transistor substrate cut along a line XV-XV' in FIG. 14.

Figure 15:
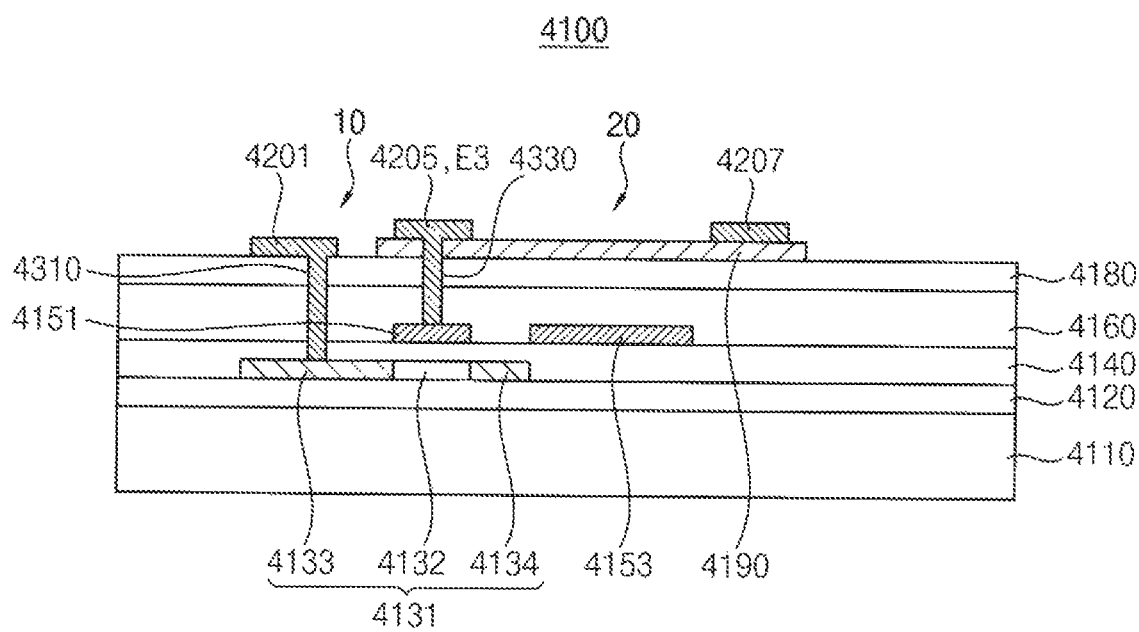
FIG. 15 is a cross-sectional view illustrating a thin-film transistor substrate according to a fifth exemplary embodiment.

Referring to FIGS. 14 and 15, the thin-film transistor substrate 4100 according to the fifth exemplary embodiment may include a first thin-film transistor 10 and a second thin-film transistor 20.

The first thin-film transistor 10 may include a first semiconductor layer 4131 and a first gate electrode 4151. The second thin-film transistor 20 may include a second semiconductor layer 4190, a second gate electrode 4153, and a third electrode E3. In an exemplary embodiment, the third electrode E3 may be any one of a second drain electrode 4205 and a second source electrode 4207 of the second thin-film transistor 20.

The first gate electrode 4151 and the third electrode E3 may be electrically connected to each other. The first gate electrode 4151 and the third electrode E3 may be overlapped with each other.

A buffer layer 4120 may be disposed on a substrate 4110. The first semiconductor layer 4131 may be disposed on the buffer layer 4120. The first semiconductor layer 4131 may be formed of polycrystalline semiconductor. The first semiconductor layer 4131 may include a channel region 4132, and a drain region 4133 and a source region 4134 which are formed opposing sides of the channel region 4132. A first insulation layer 4140 may be disposed on the buffer layer 4120. The first insulation layer 4140 may cover the first semiconductor layer 4131. The first gate electrode 4151 and the second gate electrode 4153 may be disposed on the first insulation layer 4140. The first gate electrode 4151 may overlap the channel region 4132 of the first semiconductor layer 4131. The second gate electrode 4153 may be spaced apart from the first gate electrode 4151, and may be disposed at substantially the same level as the first gate electrode 4151. A second insulation layer 4160 and a third insulation layer 4180 may be disposed on the first insulation layer 4140. The second insulation layer 4160 and the third insulation layer 4180 may cover the first gate electrode 4151 and the second gate electrode 4153. The second semiconductor layer 4190 may be disposed on the third insulation layer 4180. The second semiconductor layer 4190 may overlap at least a portion of the first semiconductor layer 4131. The second semiconductor layer 4190 may be formed of oxide semiconductor. A first drain electrode 4201, a first source electrode 4203, the second drain electrode 4205, and the second source electrode 4207 may be disposed on the third insulation layer 4180 and the second semiconductor layer 4190.

As described above, the third electrode E3 of the second thin-film transistor 20 may be one of the second drain electrode 4205 and the second source electrode 4207. FIG. 15 illustrates that the third electrode E3 is the second drain electrode 4205; however, the fifth exemplary embodiment is not limited thereto.

The thin-film transistor substrate 4100 according to the fifth exemplary embodiment may further include a third contact hole 4330. The third contact hole 4330 may be formed on the first gate electrode 4151, and may pass through the second semiconductor layer 4190. For example, the third contact hole 4330 may pass through a portion of a region in the second semiconductor layer 4190 which overlaps the third electrode E3. The third electrode E3 may be disposed on the second semiconductor layer 4190, and may fill the third contact hole 4330 to be in contact with the first gate electrode 4151. In other words, the first gate electrode 4151 and the third electrode E3 may be overlapped and contacted by the third contact hole 4330.

The thin-film transistor substrate 4100 according to the fifth exemplary embodiment may include the first thin-film transistor 10 and the second thin-film transistor 20 which are at least partially overlapped to each other, and the first thin-film transistor 10 and the second thin-film transistor 20 may be electrically connected through the contact hole 4330 that is vertically formed. Thus, an area occupied by the thin-film transistors may decrease.

Hereinafter, a thin-film transistor substrate according to a sixth exemplary embodiment will be described with reference to FIG. 16. Descriptions on elements of the thin-film transistor substrate according to the sixth exemplary embodiment which are substantially the same as or similar to elements of the thin-film transistor substrate according to the fifth exemplary embodiment will be omitted.

Figure 16:
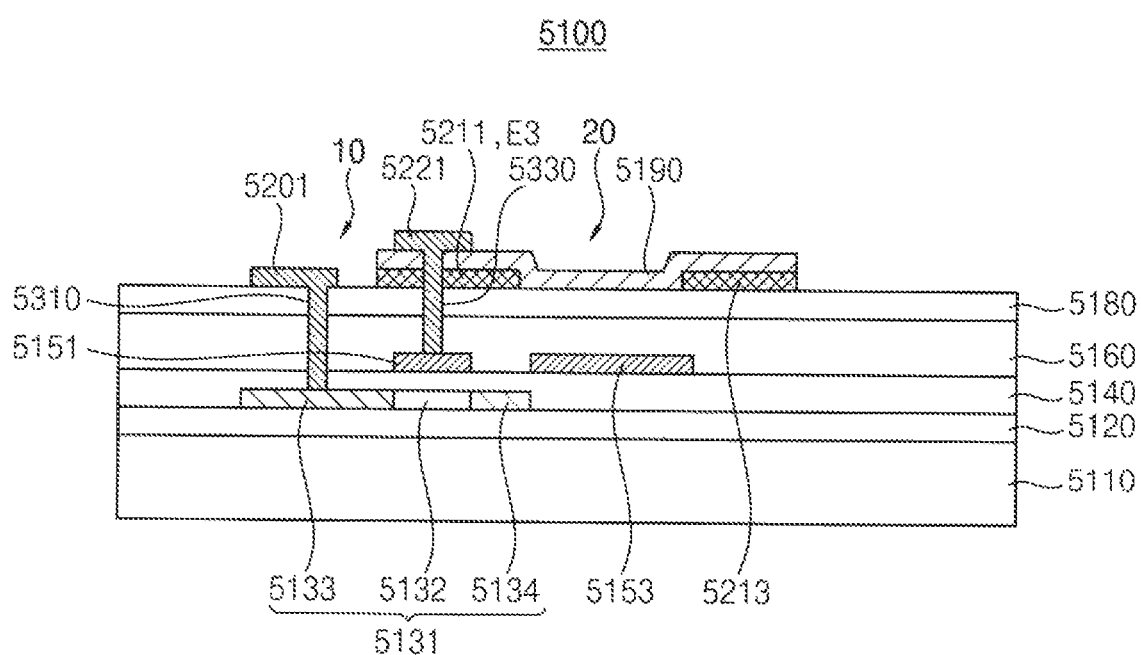
FIG. 16 is a cross-sectional view illustrating a thin-film transistor substrate according to a sixth exemplary embodiment.

FIG. 16 is a cross-sectional view illustrating a thin-film transistor substrate according to a sixth exemplary embodiment.

Referring to FIG. 16, the thin-film transistor substrate 5100 according to the sixth exemplary embodiment may include a first thin-film transistor 10 and a second thin-film transistor 20.

The first thin-film transistor 10 may include a first semiconductor layer 5131 and a first gate electrode 5151. The second thin-film transistor 20 may include a second semiconductor layer 5190, a second gate electrode 5153, and a third electrode E3. In an exemplary embodiment, the third electrode E3 may be any one of a second drain electrode 5211 and a second source electrode 5213 of the second thin-film transistor 20.

The first gate electrode 5151 and the third electrode E3 may be electrically connected to each other. The first gate electrode 5151 and the third electrode E3 may be overlapped with each other.

A buffer layer 5120 may be disposed on a substrate 5110. The first semiconductor layer 5131 may be disposed on the buffer layer 5120. The first semiconductor layer 5131 may be formed of polycrystalline semiconductor. The first semiconductor layer 5131 may include a channel region 5132, and a drain region 5133 and a source region 5134 which are formed opposing sides of the channel region 5132. A first insulation layer 5140 may be disposed on the buffer layer 5120. The first insulation layer 5140 may cover the first semiconductor layer 5131. The first gate electrode 5151 and the second gate electrode 5153 may be disposed on the first insulation layer 5140. The first gate electrode 5151 may overlap the channel region 5132 of the first semiconductor layer 5131. The second gate electrode 5153 may be spaced apart from the first gate electrode 5151, and may be disposed at substantially the same level as the first gate electrode 5151. A second insulation layer 5160 and a third insulation layer 5180 may be disposed on the first insulation layer 5140. The second insulation layer 5160 and the third insulation layer 5180 may cover the first gate electrode 5151 and the second gate electrode 5153. The second drain electrode 5211 and the source electrode 5213 may be disposed on the third insulation layer 5180. The second semiconductor layer 5190 may be disposed on the third insulation layer 5180 to cover the second drain electrode 5211 and the source electrode 5213. The second semiconductor layer 5190 may overlap at least a portion of the first semiconductor layer 5131. At least a portion of the second semiconductor layer 5190 may overlap the second gate electrode 5153. Further, a first region of the second semiconductor layer 5190 may contact the second drain electrode 5211, and a second region of the second semiconductor layer 5190 which is different from the first region may contact the second source electrode 5213. A drain electrode 5201 and a source electrode (not illustrated) may be disposed on the third insulation layer 5180.

As described above, the third electrode E3 of the second thin-film transistor 20 may be one of the second drain electrode 5211 and the second source electrode 5213. FIG. 16 illustrates that the third electrode E3 is the second drain electrode 5211; however, the sixth exemplary embodiment is not limited thereto.

The thin-film transistor substrate 5100 according to the sixth exemplary embodiment may further include a third contact hole 5330 and an auxiliary electrode 5221.

The third contact hole 5330 may be formed on the first gate electrode 5151, and may pass through the second semiconductor layer 5190 and the third electrode E3. For example, the third contact hole 5330 may pass through a portion of a region in the second semiconductor layer 5190 which overlaps the third electrode E3. The auxiliary electrode 5221 may be disposed on the second semiconductor layer 5190, and may fill the third contact hole 5330 to be in contact with the first gate electrode 5151 and the third electrode E3. In other words, the first gate electrode 5151 and the third electrode E3 may be overlapped and contacted by the auxiliary electrode 5221 that fills the third contact hole 5330.

The thin-film transistor substrate 5100 according to the sixth exemplary embodiment may include the first thin-film transistor 10 and the second thin-film transistor 20 which are at least partially overlapped with each other, and the first thin-film transistor 10 and the second thin-film transistor 20 may be electrically connected by the auxiliary electrode 5221 filling the contact hole 5330 that is vertically formed. Thus, an area occupied by the thin-film transistors may decrease.

Figure 17:
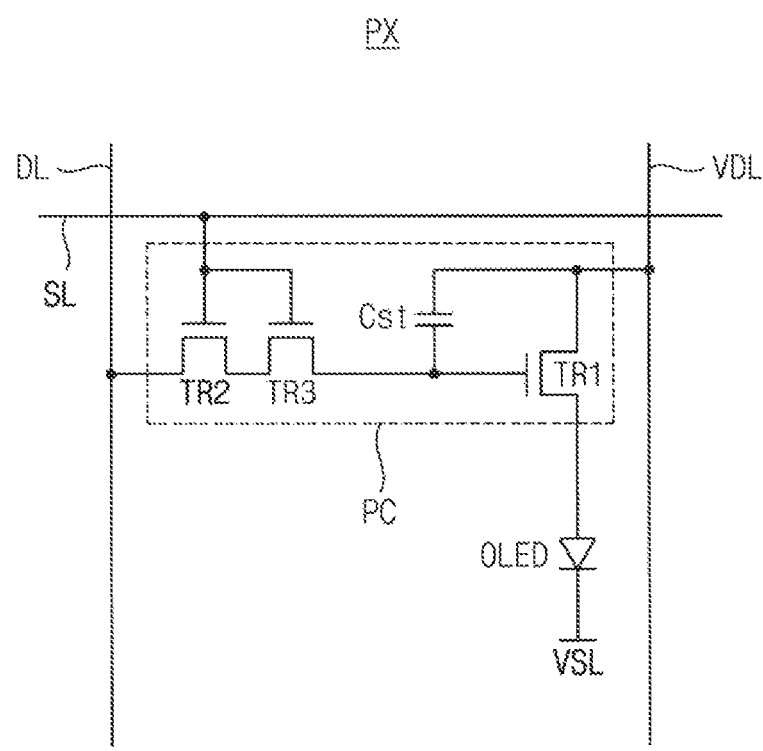
FIG. 17 is a circuit diagram illustrating a pixel of a thin-film transistor substrate according to some exemplary embodiments.

FIG. 17 is a circuit diagram illustrating a pixel of a thin-film transistor substrate according to some exemplary embodiments.

Referring to FIG. 17, the pixel PX according to some exemplary embodiments may include a pixel circuit PC and an organic light emitting element OLED. The pixel circuit PC may include at least one transistor and at least one capacitor. The pixel circuit PC may receive signals from wirings disposed in the display region DA, and may transmit a driving current to the organic light emitting element OLED. The organic light emitting element OLED may emit light having a luminance that correspond to a level or a duration of the driving current.

In an exemplary embodiment, the pixel circuit PC may include three transistors TR1, TR2, and TR3 and one capacitor Cst. However, the present disclosure is not limited thereto, and the pixel circuit PC may include one, two, four, or more transistors and two or more capacitors. A first transistor TR1, a second transistor TR2, and a third transistor TR3 included in the pixel circuit PC may transmit the driving current to the organic light emitting element OLED based on the signals transmitted from a data line DL, a scan line SL, a driving voltage line VDL, and a common voltage line VSL. However, a structure and/or a construction of the pixel circuit PC according to exemplary embodiments is not limited to the pixel circuit PC illustrated in FIG. 17.

The second transistor TR2 and the third transistor TR3 may be operated as a single switching element in which the second transistor TR2 and the third transistor TR3 may be simultaneously turned on in response to a scan signal supplied from the scan lines SL. A source/drain electrode of the second transistor TR2 and a source/drain electrode of the second transistor TR3 may be electrically connected to each other.

In an exemplary embodiment, the second transistor TR2 and the third transistor TR3 may include a semiconductor layer formed of polycrystalline semiconductor and a semiconductor layer formed of oxide semiconductor, respectively. An OFF current of the oxide semiconductor may be relatively low. Therefore, when the oxide semiconductor is applied to the switching element whose OFF state is considerably longer than ON state, power consumption may be reduced in a standby mode or during a low speed driving mode (or a low frequency driving mode). Thus, any one of the second transistor TR2 and the third transistor TR3 may advantageously include oxide semiconductor having low OFF current in terms of power consumption. Further, any one of the second transistor TR2 and the third transistor TR3 may advantageously include polycrystalline semiconductor having high electron mobility in terms of a response speed and driving reliability.

Figure 18:
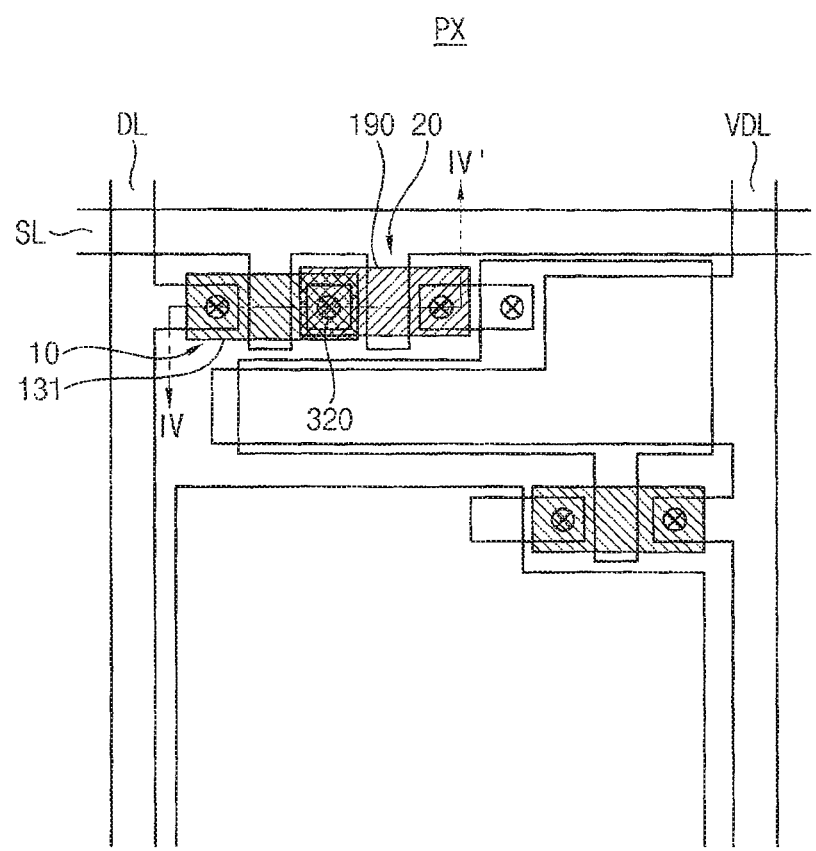
FIG. 18 is a layout view illustrating a pixel in FIG. 17.

FIG. 18 is a layout view illustrating a pixel in FIG. 17.

Referring to FIG. 18, the second transistor TR2 and the third transistor TR3 illustrated in FIG. 17 may be respectively implemented as the first thin-film transistor 10 and the second thin-film transistor 20 of the thin-film transistor substrate 100 according to the first exemplary embodiment. However, the present disclosure is not limited thereto. The second transistor TR2 and the third transistor TR3 illustrated in FIG. 17 may be respectively implemented as the first thin-film transistor 10 and the second thin-film transistor 20 of the thin-film transistor substrate 1100 according to the second exemplary embodiment, the thin-film transistor substrate 2100 according to the third exemplary embodiment, or the thin-film transistor substrate 3100 according to the fourth exemplary embodiment.

The thin-film transistor substrate according to exemplary embodiments of the present disclosure may be applied to a display device included in a computer, a notebook, a mobile phone, a smartphone, a smart pad, a PMP, a PDA, an MP3 player, or the like.

Although the thin-film transistor substrate and the method of manufacturing the thin-film transistor substrate according to the exemplary embodiments of the present disclosure have been described with reference to the drawings, the illustrated embodiments are examples, and may be modified and changed by a person having ordinary knowledge in the relevant technical field without departing from the technical spirit of the present disclosure described in the following claims.

What is claimed is:

1. A thin-film transistor substrate, comprising:
   a first thin-film transistor disposed on a substrate, the first thin-film transistor comprising a first semiconductor layer and a first gate electrode; and
   a second thin-film transistor comprising, a second gate electrode, a first electrode electrically connected to the first gate electrode, and a second semiconductor layer disposed on the first semiconductor layer and overlapping at least a portion of the first semiconductor layer,
   wherein the first electrode overlaps the first gate electrode.

2. The thin-film transistor substrate of claim 1, wherein the first electrode is one of a source electrode and a drain electrode of the second thin-film transistor.

3. The thin-film transistor substrate of claim 1, wherein the first gate electrode is disposed between the first semiconductor layer and the first electrode.

4. The thin-film transistor substrate of claim 1, further comprising:
   a contact hole formed on the first gate electrode, the contact hole passing through the second semiconductor layer, at least a portion of the contact hole overlapping the first gate electrode and the second semiconductor layer, respectively,
   wherein the first electrode is disposed on the second semiconductor layer and contacts the first gate electrode by filling the contact hole.

5. The thin-film transistor substrate of claim 4, wherein the second gate electrode faces the first electrode with the second semiconductor layer interposed therebetween.

6. The thin-film transistor substrate of claim 5, wherein the first gate electrode and the second gate electrode are disposed at a same level over the substrate.

7. The thin-film transistor substrate of claim 1, further comprising:
   a contact hole formed on the first gate electrode, the contact hole passing through the second semiconductor layer and the first electrode, at least a portion of the contact hole overlapping the first gate electrode and the second semiconductor layer, respectively; and
   an auxiliary electrode disposed on the second semiconductor layer, the auxiliary electrode electrically connected to the first gate electrode and the second electrode by filling the contact hole.

8. The thin-film transistor substrate of claim 7, wherein the first electrode is disposed between the first semiconductor layer and the second semiconductor layer.

9. The thin-film transistor substrate of claim 8, wherein the second gate electrode faces the second semiconductor layer with the first electrode interposed therebetween.

10. The thin-film transistor substrate of claim 9, wherein the first gate electrode and the second gate electrode are disposed at a same level over the substrate.

* * * * *